US010177065B2

(12) United States Patent
Kim

(10) Patent No.: US 10,177,065 B2
(45) Date of Patent: *Jan. 8, 2019

(54) SILICON-BASED HEAT DISSIPATION DEVICE FOR HEAT-GENERATING DEVICES

(71) Applicant: Gerald Ho Kim, Fallbrook, CA (US)

(72) Inventor: Gerald Ho Kim, Fallbrook, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/678,921

(22) Filed: Aug. 16, 2017

(65) Prior Publication Data

US 2018/0019179 A1    Jan. 18, 2018

Related U.S. Application Data

(63) Continuation-in-part of application No. 14/872,391, filed on Oct. 1, 2015, now Pat. No. 9,743,555, which is a continuation-in-part of application No. 13/929,791, filed on Jun. 28, 2013, now Pat. No. 9,159,642.

(Continued)

(51) Int. Cl.
| | |
|---|---|
| *H01L 23/367* | (2006.01) |
| *F28F 3/04* | (2006.01) |
| *H05K 1/02* | (2006.01) |
| *H01L 23/373* | (2006.01) |
| *H05K 7/20* | (2006.01) |
| *H01L 23/40* | (2006.01) |

(Continued)

(52) U.S. Cl.
CPC ......... *H01L 23/3672* (2013.01); *F28F 3/048* (2013.01); *H01L 23/367* (2013.01); *H01L 23/3738* (2013.01); *H05K 1/0209* (2013.01); *H05K 7/20409* (2013.01); *H01L 2023/4018* (2013.01); *H01L 2924/0002* (2013.01); *H01S 5/021* (2013.01); *H01S 5/02469* (2013.01)

(58) Field of Classification Search
CPC ........... H01L 23/367; H01L 2924/0002; H01L 23/3738; H01L 23/373; H01L 2924/00; H05K 7/20409; H05K 7/20; H05K 1/02; H05K 1/0209; H01S 5/021; H01S 5/02469; F28F 3/048
USPC ................ 361/706, 703, 711, 709; 165/80.3, 165/104.33
See application file for complete search history.

(56) References Cited

U.S. PATENT DOCUMENTS

| | | | | |
|---|---|---|---|---|
| 6,717,060 | B2 * | 4/2004 | Kragl | ....................... G02B 6/42 174/254 |
| 2015/0091156 | A1 * | 4/2015 | Kim | .................... H01L 23/3738 257/713 |

* cited by examiner

*Primary Examiner* — Mandeep S Buttar
(74) *Attorney, Agent, or Firm* — Andy M. Han

(57) ABSTRACT

Embodiments of a silicon-based heat dissipation device and a chip module assembly are described. An apparatus includes a chip module assembly that includes a silicon-based heat dissipation device and an extended device coupled to the silicon-based heat dissipation device. The silicon-based heat dissipation device includes a base portion having a first primary side and a second primary side opposite the first primary side. The silicon-based heat dissipation device also includes a protrusion portion on the first primary side of the base portion and protruding therefrom, with the protrusion portion having a plurality of fins. The extended device includes an extended layer. The second primary side of the base portion is configured to receive one or more heat-generating devices thereon such that at least a portion of heat generated by the one or more heat-generating devices is dissipated to the silicon-based heat-dissipation device by conduction.

17 Claims, 15 Drawing Sheets

Related U.S. Application Data

(60) Provisional application No. 61/807,655, filed on Apr. 2, 2013.

(51) Int. Cl.
*H01S 5/02* (2006.01)
*H01S 5/024* (2006.01)

SILICON-BASED HEAT DISSIPATION DEVICE FOR HEAT-GENERATING DEVICES

CROSS REFERENCE TO RELATED PATENT APPLICATION

The present disclosure is part of a continuation-in-part (CIP) application of U.S. patent application Ser. No. 14/872,391, filed on 1 Oct. 2015 and issued as U.S. Pat. No. 9,743,555 on 22 Aug. 2017, which is a continuation-in-part (CIP) of U.S. patent application Ser. No. 13/929,791, filed on 28 Jun. 2013 and issued as U.S. Pat. No. 9,159,642 on 13 Oct. 2015, which is a non-provisional of U.S. Patent Application No. 61/807,655, filed 2 Apr. 2013 and entitled "Silicon-Based Heat Dissipation Device For Heat-Generating Devices". Contents of the aforementioned applications are incorporated by reference in their entirety.

TECHNICAL FIELD

The present disclosure generally relates to the field of transfer of thermal energy and, more particularly, removal of thermal energy from electrically-driven devices.

BACKGROUND

There are many applications, ranging from consumer electronics to telecommunications and the like, in which electrically-driven devices (e.g., electronic devices such as semiconductor-based integrated circuits) capable of performing various tasks are packed in close proximity in a small form factor to serve various needs. Such electrically-driven devices may include, for example, driver circuits, microprocessors, graphics processors, memory chips, global positioning system (GPS) chips, communications chips, laser diodes including edge-emitting lasers and vertical-cavity surface-emitting lasers (VCSELs), light-emitting diodes (LEDs), photodiodes, sensors, etc. Many of such electrically-driven devices inevitably generate thermal energy, or heat, in operation and thus are heat sources during operation as well as for a period of time after power off. As the number and complexity of the functionalities performed by such electrically-driven devices continue to increase and as the distance between electrically-driven devices in the small form factor continues to decrease, heat generated by such electrically-driven devices, as heat sources, present technical challenges that need to be addressed.

For one thing, performance, useful lifespan, or both, of an electrically-driven device may be significantly impacted if the heat generated by the device is not adequately dissipated or otherwise removed from the device. Moreover, in many present-day applications, given the close proximity between two or more electrically-driven devices on the same substrate, e.g., printed circuit board (PCB), a phenomenon of thermal coupling between the two or more devices in close proximity may occur and result in the heat generated by one of the devices being transferred to one or more adjacent devices. When thermal coupling occurs, at least a portion of the heat generated by a first electrically-driven device is transferred to a second electrically-driven device in close proximity due to temperature gradient, such that the temperature of the second electrically-driven device rises to a point higher than it would be when no heat is transferred from the first electrically-driven device to the second electrically-driven device. More specifically, when thermal coupling occurs and when no adequate heat transfer mechanism exists, heat generated by electrically-driven devices in close proximity may detrimentally deteriorate the performance and useful lifespan of some or all of the affected devices. As electrically-driven devices generate heat, they are referred to as heat-generating devices hereinafter.

Metal heat sinks or radiators, based on copper or aluminum for example, have been a dominant heat sink choice for electronics or photonics applications. As the form factor of electronic components (e.g., integrated circuits or IC) gets smaller it is impractical to build a small metal heat sink with a large surface area heat sink. Other problems associated with metal heat sinks include, for example, difficulty in precision alignment in mounting laser diode bars, VCSELs, LEDs or chips in laser diode/VCSEL/LED cooling applications, issues with overall compactness of the package, corrosion of the metallic material in water-cooled applications, difficulty in manufacturing, high-precision fabrication, electrical isolation, etc. Yet, increasing demand for higher power density in small form factor motivates the production of a compact cooling package with fewer or none of the aforementioned issues. Moreover, conventional packages typically use wire bonding to provide electrical power to the electrically-driven device(s) being cooled, but wire bonding may add cost and complexity in manufacturing and may be prone to defects in addition to occupying space unnecessarily.

SUMMARY

Various embodiments disclosed herein pertain to a technique, design, scheme, device and mechanism for isolation of thermal ground for multiple heat-generating devices on a substrate.

In one aspect, an apparatus may include a plurality of heat-generating devices, a silicon-based heat dissipation device and an extended device coupled to the silicon-based heat-dissipation device. The silicon-based heat dissipation device may include a base portion having a first primary side and a second primary side opposite the first primary side. The silicon-based heat dissipation device may also include a protrusion portion on the first primary side of the base portion and protruding therefrom. The protrusion portion may include a plurality of fins. The second primary side of the base portion may be configured to receive the heat-generating devices thereon such that at least a portion of heat generated by the heat-generating devices is dissipated to the silicon-based heat-dissipation device by conduction. The base portion may include a slit opening with a first heat-generating device of the heat-generating devices on a first side of the slit opening and a second heat-generating device of the heat-generating devices on a second side of the slit opening opposite the first side of the slit opening. The extended device may include an extended layer and one or more spacers disposed between the extended layer and the silicon-based heat dissipation device.

In some embodiments, the extended layer may include a printed circuit board (PCB).

In some embodiments, the extended layer may include a silicon-based layer.

In some embodiments, the extended layer may include a glass display layer.

In some embodiments, an area of the extended layer may be configured to display textual information, graphical information, pictorial information, video images, or a combination thereof.

In some embodiments, each of the one or more spacers may be disposed between a respective corner of the extended layer and a respective corner of the silicon-based heat dissipation device to provide a gap therebetween.

In some embodiments, a thickness of each of the one or more spacers may be greater than a height of each of the heat-generating devices.

In some embodiments, the apparatus may further include a thermal interface material disposed between the silicon-based heat dissipation device and at least one of the heat-generating devices.

In another aspect, an apparatus may include a plurality of heat-generating devices, a silicon-based heat dissipation device, and an extended device coupled to the silicon-based heat-dissipation device. The silicon-based heat dissipation device may include an electrical-connection medium, a base portion having a first primary side and a second primary side opposite the first primary side, and a protrusion portion on the first primary side of the base portion and protruding therefrom. The protrusion portion may include a plurality of fins. The second primary side of the base portion may include a plurality of recesses each configured to receive a respective one of the heat-generating devices therein such that at least a portion of heat generated by the heat-generating devices is dissipated to the silicon-based heat-dissipation device by conduction. The second primary side of the base portion may also include a recessed channel that connects the recesses to one another. The electrical-connection medium may be disposed in the recessed channel and electrically connecting the heat-generating devices to one another. The extended device may include an extended layer.

In some embodiments, a depth of each of the recesses may be greater than a height of each of the heat-generating devices.

In some embodiments, the electrical-connection medium may include a wire laid in the recessed channel or an electroplated pattern printed on a surface of the recessed channel.

In some embodiments, the extended layer may include a PCB.

In some embodiments, the extended layer may include a silicon-based layer.

In some embodiments, the extended layer may include a glass display layer.

In some embodiments, an area of the extended layer may be configured to display textual information, graphical information, pictorial information, video images, or a combination thereof.

In some embodiments, the extended device may further include one or more spacers disposed between the extended layer and the silicon-based heat dissipation device.

In some embodiments, a thickness of each of the one or more spacers may be greater than a height of each of the heat-generating devices.

In some embodiments, each of the one or more spacers may be disposed between a respective corner of the extended layer and a respective corner of the silicon-based heat dissipation device to provide a gap therebetween.

In some embodiments, the apparatus may also include a thermal interface material disposed between the silicon-based heat dissipation device and the external device.

In some embodiments, the apparatus may further include a thermal interface material disposed between the silicon-based heat dissipation device and at least one of the one or more heat-generating devices.

The proposed techniques are further described below in the detailed description. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

A compact heat sink or radiator built with silicon-based material provide a compact and highly efficient heat sink for all electronics applications such as driver circuits, microprocessors, graphics processors, memory chips, GPS chips, communications chips, laser diodes including edge-emitting lasers and VCSELs, LEDs, photodiodes, sensors, etc. One advantage of a silicon-based heat sink or radiator is that it can have a surface area more than ten times that of a typical metal-based heat sink or radiator which may be fabricated by extrusion, stamping or machining process. Besides, the surface quality of the silicon fins of a silicon-based heat sink or radiator can reach an optically polished quality surpassing the surface quality of conventional metal-based heat sinks and radiators. A silicon-based heat sink or radiator does not corrode or become tarnished in atmosphere due to elements of the environment. In contrast, metal-based heat sinks and radiators tend to foul and/or corrode over time. The aforementioned advantages enhance the reliability and thermal dissipation efficiency of silicon-based heat sinks and radiators.

Illustrative Implementations

Figure 1:
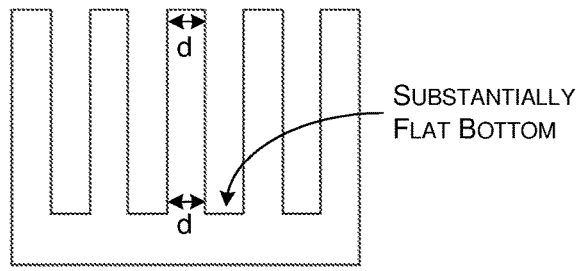
FIG. 1 is a partial cross-sectional view of a heat dissipation device in accordance with an embodiment of the present disclosure.
Figure 2:
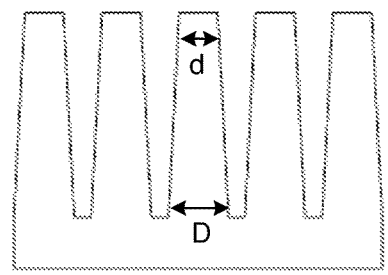
FIG. 2 is a partial cross-sectional view of a heat dissipation device in accordance with an embodiment of the present disclosure.
Figure 3:
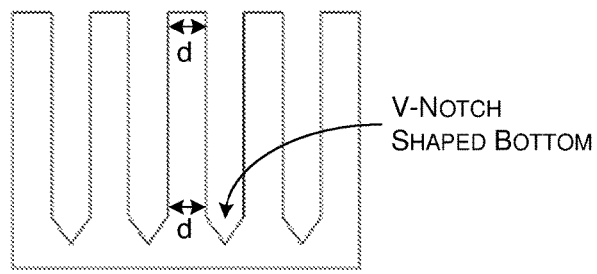
FIG. 3 is a partial cross-sectional view of a heat dissipation device in accordance with an embodiment of the present disclosure.
Figure 4:
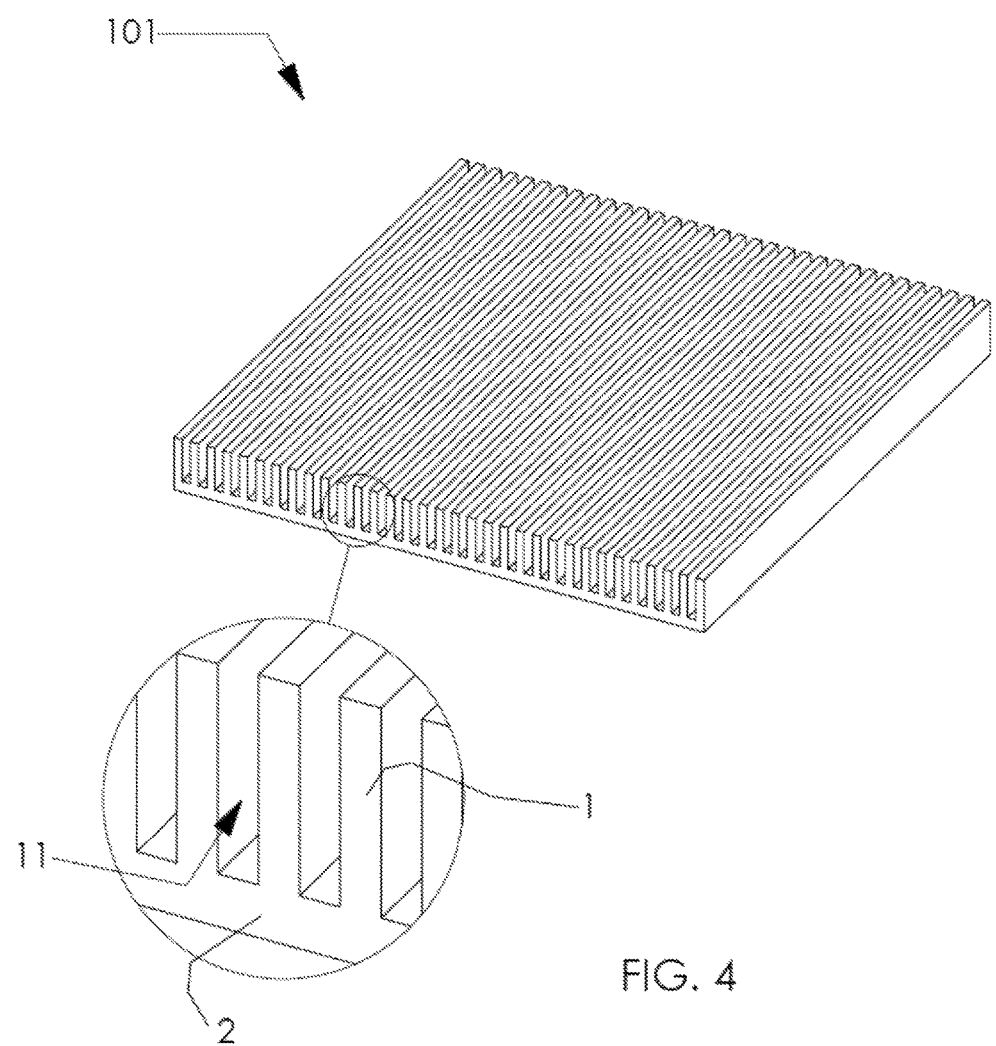
FIG. 4 is a perspective view of a heat dissipation device in accordance with an embodiment of the present disclosure.
Figure 5:
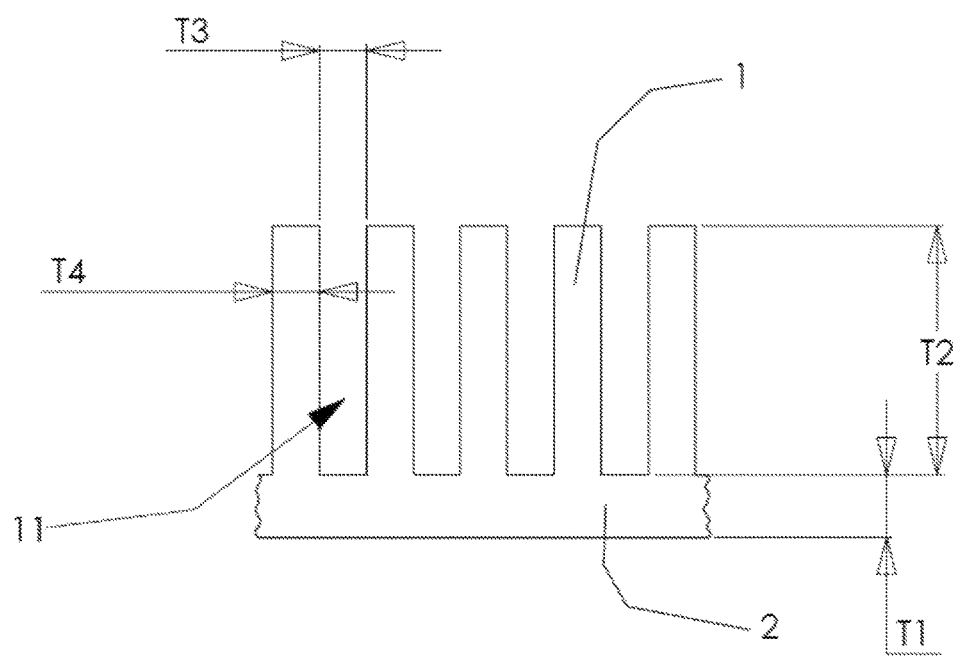
FIG. 5 is a partial cross-sectional view of the heat dissipation device of FIG. 4.

Each of FIGS. 1-3 respectively illustrates a partial cross-sectional view of a silicon-based heat dissipation device in accordance with an embodiment of the present disclosure. FIG. 4 illustrates a silicon-based heat dissipation device 101 in accordance with an embodiment of the present disclosure. FIG. 5 illustrates dimensions associated with the silicon-based heat dissipation device of FIG. 4. The following description refers to FIGS. 1-5.

Each of FIGS. 1-3 illustrates a respective embodiment of a cross-sectional view of a fin structure of multiple straight fins of a silicon-based heat dissipation device 101. Due to efficient thermal performance and compact structure of the silicon-based heat dissipation device 101, a surface area at least ten times that of a typical metal-based heat sink or radiator to interact with air (or air-sol) for cooling can be achieved.

FIG. 1 shows an embodiment of a first design 51 in which sidewalls of the fins are parallel or substantially parallel to one another. For instance, as shown in FIG. 1, the width of the cross section along a longitudinal direction of each of the fins in design 51 may remain substantially the same throughout the height of the fin, with a dimension d near the bottom portion of the fin and with the dimension d near the top or tip of the fin. Also, the bottom of the fin structure where a fin is connected to its immediately adjacent fin(s) may be flat or substantially flat.

FIG. 2 shows an embodiment of a second design 52 in which sidewalls of the fins are tapered. For instance, as shown in FIG. 2, the width of the cross section along a longitudinal direction of each of the fins in design 52 may gradually decrease from bottom to top in a linear or non-linear fashion, with a dimension D near the bottom portion of the fin and with a dimension d near the top or tip of the fin, where D is greater than d. Also, the bottom of the fin structure where a fin is connected to its immediately adjacent fin(s) may be flat or substantially flat. In embodiments in which the width of the cross section of each of the fins gradually decreases in a linear fashion (shown in FIG. 2), a contour of the cross section of a fin may be a straight line. In embodiments in which the width of the cross section of each of the fins gradually decreases in a non-linear fashion (not shown), a contour of the cross section of a fin may be curved, or having at least a portion curved and at least another portion straight (e.g., partially curved and partially straight).

FIG. 3 shows an embodiment of a first design 53 in which sidewalls of the fins are parallel or substantially parallel to one another. For instance, as shown in FIG. 3, the width of the cross section along a longitudinal direction of each of the fins in design 53 may remain substantially the same throughout the height of the fin, with a dimension d near the bottom portion of the fin and with the dimension d near the top or tip of the fin. Different from design 51, in design 53 the bottom of the fin structure where a fin is connected to its immediately adjacent fin(s) may be grooved with a cross-sectional shape that resembles a V-notch shape.

The silicon-based heat dissipation device 101 shown in FIG. 4 can be fabricated from a piece of single-crystal silicon by etching various structural shapes as shown in FIGS. 1-3. As shown in FIG. 4, the silicon-based heat dissipation device 101 has a base portion 2 and a protrusion portion 1. The base portion 2 has a first primary side (e.g., the side that faces up in FIG. 4) and a second primary side (e.g., the side that faces down in FIG. 4) opposite the first primary side. The protrusion portion 1 of the silicon-based heat dissipation device 101 is on the first primary side of the base portion 2 and protrudes therefrom. In the example shown in FIG. 4, the protrusion portion 1 includes multiple straight fins. The multiple straight fins of the protrusion portion 1 may be spaced apart from each other by an equidistant spacing 11. Additionally or alternatively, the protrusion portion 1 may include pin fins and/or flared fins. In one embodiment, the silicon-based heat dissipation device 101 may be made from a single-crystal silicon wafer where multiple grooves are etched onto one side of the silicon wafer by etching, e.g., chemical etching, to form the multiple straight fins of the protrusion portion 1. In some embodiments, the multiple straight fins of the protrusion portion 1 may be formed to adopt design 51 of FIG. 1. In some embodiments, the multiple straight fins of the protrusion portion 1 may be formed to adopt design 52 of FIG. 2. In some embodiments, the multiple straight fins of the protrusion portion 1 may be formed to adopt design 53 of FIG. 3. In some embodiments, one portion of the multiple straight fins of the protrusion portion 1 may be formed to adopt one of design 51, design 52 or design 53, while another portion of the multiple straight fins of the protrusion portion 1 may be formed to adopt the other of design 51, design 52 or design 53.

As shown in FIG. 5, there are several dimensions associated with the silicon-based heat dissipation device 101. T1 denotes a thickness of the base portion 2 that is measured across the base portion 2 in a direction parallel to the first primary side of the base portion 2. T2 denotes a height of the protrusion portion 1, or the fins of the protrusion portion 1, that is measured from the first primary side of the base portion 2 in a direction perpendicular to the first primary side of the base portion 2. T3 denotes a width of the spacing 11 between every two adjacent fins of the protrusion portion 1. T4 denotes a thickness of each of the fins of the protrusion portion 1, measured across a respective one of the fins in a direction parallel to the first primary side of the base portion 2.

In one embodiment, the ratio T2:T4 is a large number in order to increase the surface area of the silicon-based heat dissipation device 101 in a small footprint of silicon base. In order to achieve a high convective cooling in the silicon-based heat dissipation device 101, the ratio of T2:T4 is greater than 5:1. Similarly, the ratio T2:T1 is greater than 5:1. Moreover, in one embodiment, T3 is greater than or equal to T4. These dimensions and ratios provide an optimum performance of the silicon-based heat dissipation device 101. For example, if each of the dimensions T3 and T4 is 100 microns with T2 being 500 microns and T1 being 100 microns, then the silicon-based heat dissipation device 101 would have a large amount of surface area in a compact form factor. However, air flow through the spacing 11 between every two adjacent fins of the protrusion portion 1 may be restricted due to small gap, T3 to ineffectively remove all heat from silicon fin. To maximize thermal convection by air flow through the spacing 11 between every two adjacent fins of the protrusion portion 1, in various implementations the dimension T3 and air speed can be increased to achieve quick removal of heat from the fins of the silicon-based heat dissipation device 101.

Figure 6:
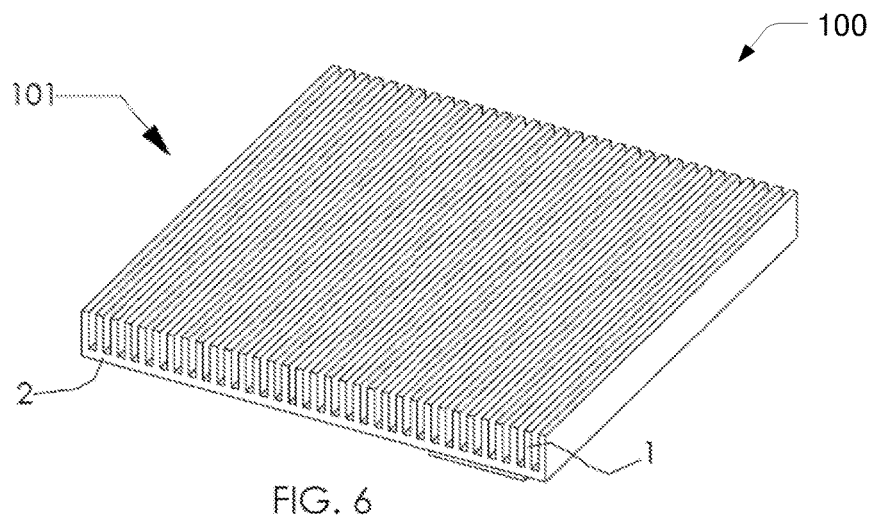
FIG. 6 is a perspective top view of a device in accordance with an embodiment of the present disclosure.
Figure 7:
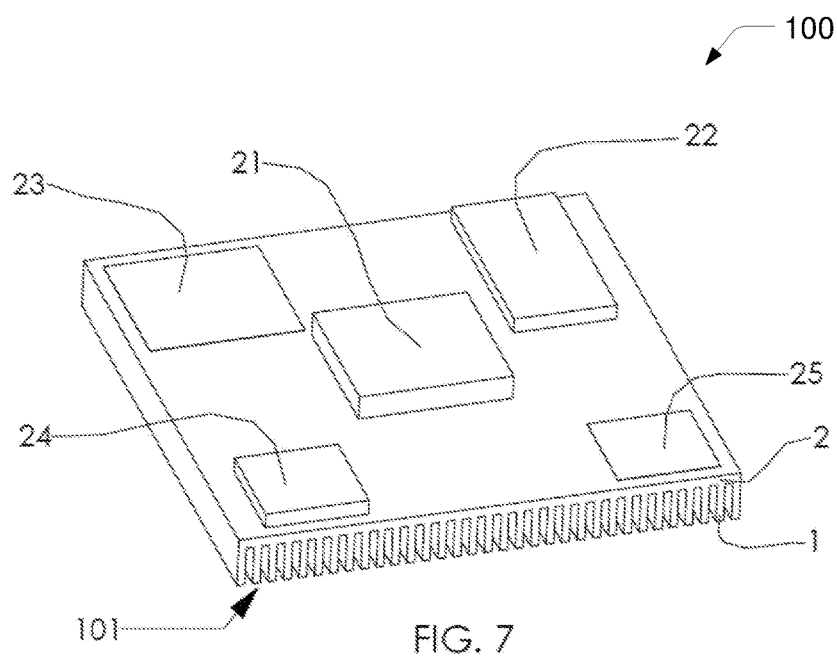
FIG. 7 is a perspective bottom view of the device of FIG. 6.
Figure 8:
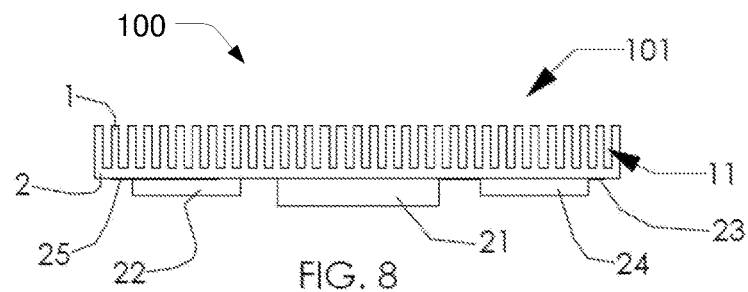
FIG. 8 is a side view of the device of FIG. 6.

FIGS. 6-8 illustrate a device 100 in accordance with an embodiment of the present disclosure. The following description refers to FIGS. 6-8.

FIG. 6 shows the device 100 which is a monolithic structure of IC chip or Silicon-On-Insulator (SOI) combined with the silicon-based heat dissipation device 101. Typically integrated circuits are developed or laid-down on a primary side of a silicon wafer, and then the backside of the silicon wafer opposite the primary side is lapped to make a thin silicon IC chip. In one embodiment, the silicon-based heat dissipation device 101 is built or attached to the backside of the IC or SOI chip to increase the heat dissipation by increasing the surface area of the existing backside of the IC or SOI structure. The silicon-based heat dissipation device 101 built on the backside of the IC or SOI chip provides more than ten times (10X) of surface area to dissipate heat from the integrated circuits by convection or forced air, compared to conventional metal-based heat sinks or radiators.

As shown in FIGS. 7 and 8, each of heat-generating devices 21-25 may be embedded in or physically coupled, mounted or otherwise attached to the second primary side of the base portion 2, which is preferably flat and smooth to facilitate maximum contact, and thus thermal conduction, with the heat-generating devices 21-25. Each of heat-generating devices 23 and 25 may be an electronics device. In some implementations, each of heat-generating devices 23 and 25 may be embedded or doped integrated circuit while each of heat-generating devices 21, 22 and 24 may be a driver chip, microprocessor, graphics processor, memory chip, GPS chip, communications chip, laser diode (edge-emitting or VCSEL), LED, photodiode, sensor or the like. Regardless what the case may be, each of heat-generating devices 21-25 generates heat when powered on for which heat needs to be removed to prolong the operational life and enhance the performance of the heat-generating devices 21-25. One of ordinary skill in the art would appreciate that, although multiple heat-generating devices are shown in FIGS. 7 and 8, in various embodiments the number of heat-generating devices may be more or less depending on the actual implementation. Although a fixed number of heat-generating devices is shown in FIG. 7, in various embodiments according to the present disclosure there may be a different number of heat-generating devices.

Figure 9:
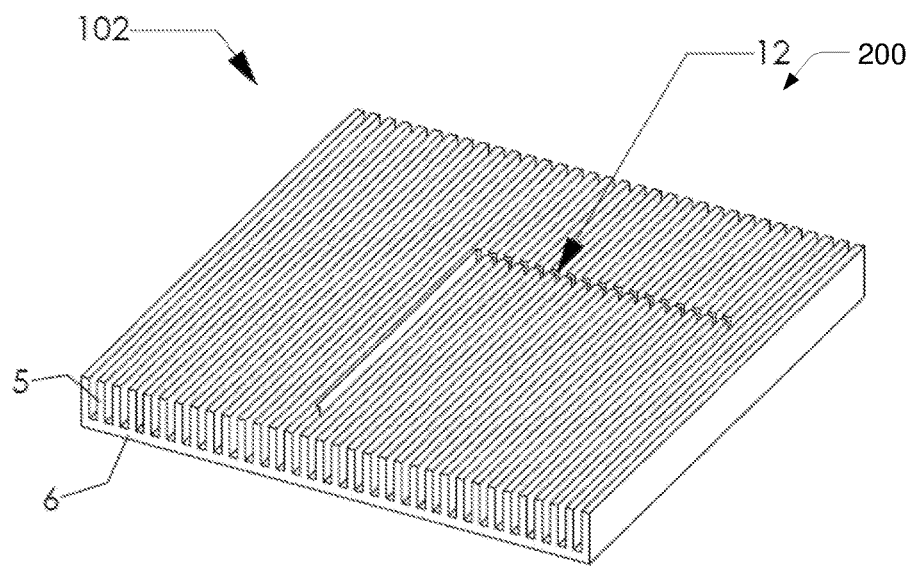
FIG. 9 is a perspective top view of a device in accordance with another embodiment of the present disclosure.
Figure 10:
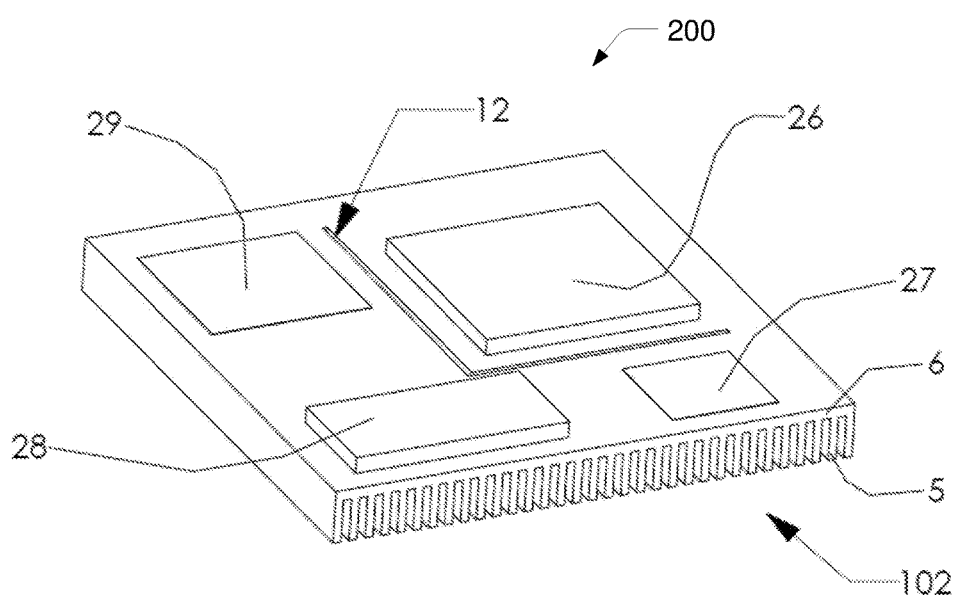
FIG. 10 is a perspective bottom view of the device of FIG. 9.

FIGS. 9 and 10 illustrate a device 200 in accordance with another embodiment of the present disclosure. The following description refers to FIGS. 9 and 10.

The device 200 and the device 100 are similar in many ways. In the interest of brevity, detailed description of differences between the device 200 and the device 100 is provided herein while similarity therebetween is not repeated. As shown in FIGS. 9 and 10, the device 200 includes a silicon-based heat dissipation device 102 that has a base portion 6 and a protrusion portion 5. The base portion 6 has a first primary side and a second primary side opposite the first primary side. The protrusion portion 5 is on the first primary side of the base portion 6 and protrudes therefrom. The protrusion portion 5 may include multiple straight fins similar to those of the protrusion portion 1 of the silicon-based heat dissipation device 101. For example, the silicon-based heat dissipation device 102 may be made from a single-crystal silicon wafer where multiple grooves are etched onto one side of the silicon wafer by etching, e.g., chemical etching, to form the multiple straight fins of the protrusion portion 5. In some embodiments, the multiple straight fins of the protrusion portion 5 may be formed to adopt design 51 of FIG. 1. In some embodiments, the multiple straight fins of the protrusion portion 5 may be formed to adopt design 52 of FIG. 2. In some embodiments, the multiple straight fins of the protrusion portion 5 may be formed to adopt design 53 of FIG. 3. In some embodiments, one portion of the multiple straight fins of the protrusion portion 5 may be formed to adopt one of design 51, design 52 or design 53, while another portion of the multiple straight fins of the protrusion portion 5 may be formed to adopt the other of design 51, design 52 or design 53.

The silicon-based heat dissipation device 102 includes a slit opening 12 on the base portion 6 that fluidly or communicatively connects the first primary side and the second primary side of base portion 6. That is, the slit opening 12 traverses the thickness of base portion 6. The slit opening 12 cuts off, or severs, a direct-line thermal coupling path via conduction through the base portion 6 between a first heat-generating device on one side of the slit opening 12 and a second heat-generating device on the other side of the slit opening 12. As shown in FIG. 9, at least one fin of the multiple fins of protrusion portion 5 may be dissected by at least one portion of the slit opening 12 into two separate fins. In one embodiment, the slit opening 12 may include an L-shaped slit opening as shown in FIGS. 9 and 10. Alternatively, the slit opening 12 may include a straight line, a non-straight line, a curved line or a zigzag line, depending on the actual implementation. In other embodiments, instead of a slit opening, the base portion 6 may include a trench or groove on either its first primary side or second primary side. Whether a slit opening or a groove or trench, such design would minimize thermal coupling by conduction between two or more heat-generating devices that are disposed on the heat dissipation device 102.

In the example shown in FIG. 10, each of heat-generating devices 26-29 is embedded in or physically coupled, mounted or otherwise attached to the second primary side of the base portion 6, which is preferably flat and smooth to facilitate maximum contact, and thus thermal conduction, with the heat-generating devices 26-29. In some implementations, each of heat-generating devices 26-29 may be an embedded or doped integrated circuit, a driver chip, microprocessor, graphics processor, memory chip, GPS chip, communications chip, laser diode (edge-emitting or VCSEL), LED, photodiode, sensor or the like. Regardless what the case may be, each of heat-generating devices 26-29 generates heat when powered on for which heat needs to be removed to prolong the operational life and enhance the performance of the heat-generating devices 26-29. As shown in FIG. 10, the heat-generating device 26 is on one side of the L-shaped slit opening 12 while the heat-generating devices 27, 28 and 29 are on the other side of the L-shaped slit opening 12. The slit opening 12 provides the function of severing a direct-line thermal coupling path (i.e., thermal conduction path) through the base portion 6 between the heat-generating device 26 and each of the heat-generating devices 27, 28 and 29. In this way, the absolute temperature of each of the heat-generating device 27, 28 and 29 can be more effectively lowered since they would not be heated by heat from the heat-generating device 26. This arrangement may be suitable, for example, when the heat-generating device 26 (e.g., a microprocessor) generates more heat than each of the heat-generating devices 27, 28 and 29 during operation. In one embodiment, the silicon-based heat dissipation device 102 may be fabricated on the backside of an IC or SOI chip. Although a fixed number of heat-generating devices is shown in FIG. 10, in various embodiments according to the present disclosure there may be a different number of heat-generating devices.

Figure 11:
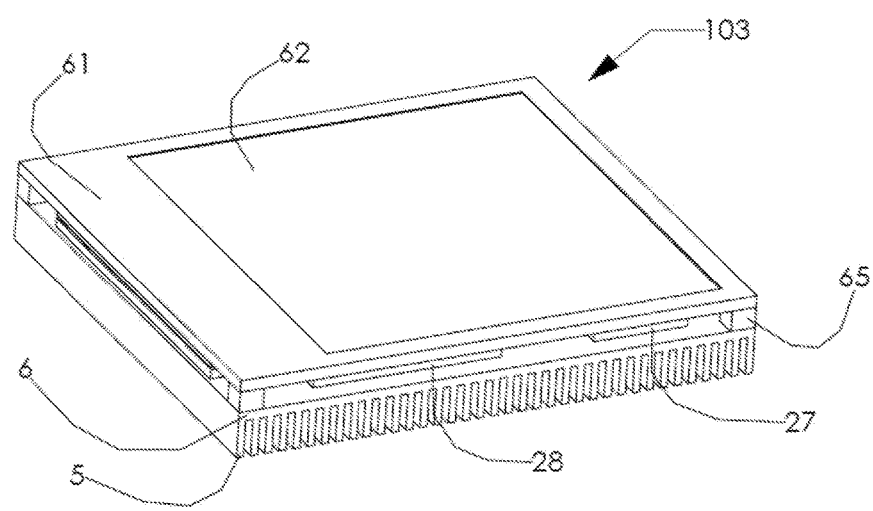
FIG. 11 is a perspective view of a chip module assembly utilizing heat dissipation devices in accordance with an embodiment of the present disclosure.
Figure 12:
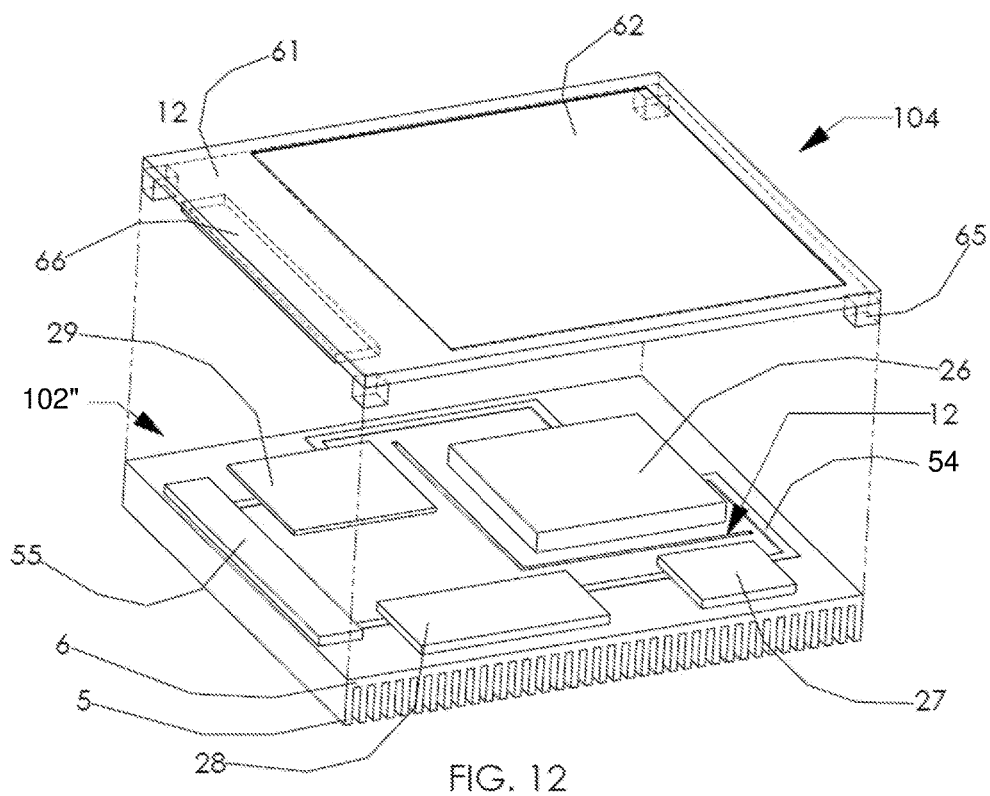
FIG. 12 is an exploded view of the chip module assembly of FIG. 11.
Figure 12A:
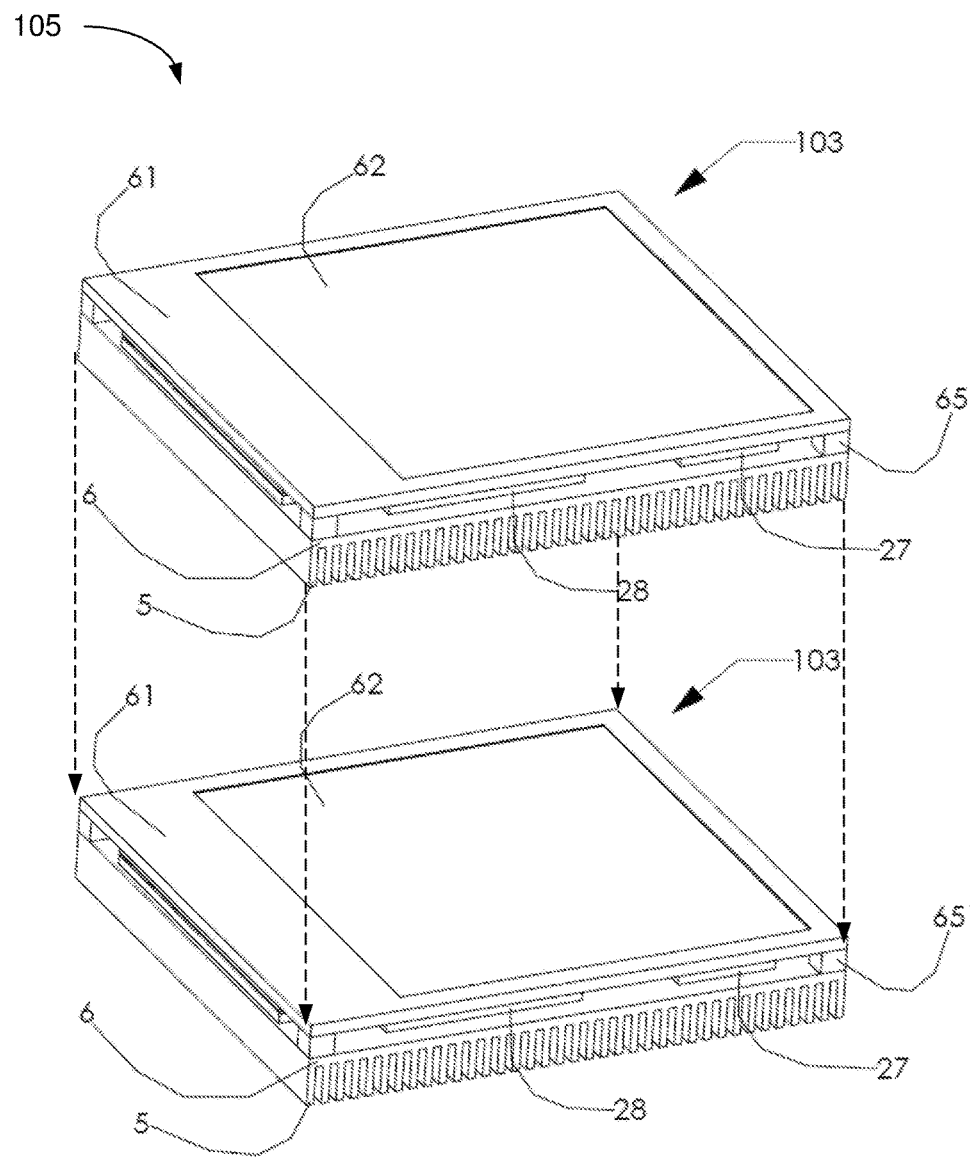
FIG. 12A is an exploded view of an apparatus having a stack of multiple chip module assemblies of FIG. 11.

FIGS. 11 and 12 illustrate a chip module assembly 103 in accordance with an embodiment of the present disclosure. FIG. 12A illustrates an apparatus 105 having a stack of multiple chip module assemblies 103. The following description refers to FIGS. 11 and 12.

Chip module assembly 103 may include an assembly of a silicon-based heat dissipation device 102" and an extended device 104 bonded, affixed or otherwise coupled to each other. For instance, silicon-based heat dissipation device 102" and extended device 104 may be bonded together with a thermal interface material disposed therebetween to facilitate thermal transfer from one to the other, and vice versa. Similar to silicon-based heat dissipation device 102, silicon-based heat dissipation device 102" may include a base portion 6 and a protrusion portion 5. The base portion 6 has a first primary side and a second primary side opposite the first primary side. The protrusion portion 5 is on the first primary side of the base portion 6 and protrudes therefrom. The protrusion portion 5 may include multiple straight fins similar to those of the protrusion portion 1 of the silicon-based heat dissipation device 101. For example, the silicon-based heat dissipation device 102" may be made from a single-crystal silicon wafer where multiple grooves are etched onto one side of the silicon wafer by etching, e.g., chemical etching, to form the multiple straight fins of the protrusion portion 5. In some embodiments, the multiple straight fins of the protrusion portion 5 may be formed to adopt design 51 of FIG. 1. In some embodiments, the multiple straight fins of the protrusion portion 5 may be formed to adopt design 52 of FIG. 2. In some embodiments, the multiple straight fins of the protrusion portion 5 may be formed to adopt design 53 of FIG. 3. In some embodiments, one portion of the multiple straight fins of the protrusion portion 5 may be formed to adopt one of design 51, design 52 or design 53, while another portion of the multiple straight fins of the protrusion portion 5 may be formed to adopt the other of design 51, design 52 or design 53.

In addition, silicon-based heat dissipation device 102" may include a connector 55 which may be disposed on the same side/surface of silicon-based heat dissipation device 102" on which heat-generating devices 26-29 are disposed. In some implementations, each of heat-generating devices 26-29 may be an electronics device. In some implementations, each of heat-generating devices 26-29 may be embedded in or physically coupled, mounted or otherwise attached to the second primary side of the base portion 6, which is preferably flat and smooth to facilitate maximum contact, and thus thermal conduction, with the heat-generating devices 26-29. In some implementations, each of heat-generating devices 26-29 may be an embedded or doped integrated circuit, a driver chip, microprocessor, graphics processor, memory chip, GPS chip, communications chip, laser diode (edge-emitting or VCSEL), LED, photodiode, sensor or the like. Regardless what the case may be, each of heat-generating devices 26-29 generates heat when powered on for which heat needs to be removed to prolong the operational life and enhance the performance of the heat-generating devices 26-29. In some embodiments, a thermal interface material may be sandwiched between silicon-based heat dissipation device 102" and at least one of heat-generating devices 26-29 to aid thermal transfer of heat from the respective heat-generating device(s) to silicon-based heat dissipation device 102". Additionally, silicon-based heat dissipation device 102" may include an electrical-connection medium 54 that provides electrical connection between two or more of heat-generating devices 26-29 and connector 55. Electrical-connection medium 54 may be, for example and not limited to, one or more wires, ribbon cables, electroplated patterns, or a combination thereof. Although a fixed number of heat-generating devices is shown in FIG. 12, in various embodiments according to the present disclosure there may be a different number of heat-generating devices.

Similar to silicon-based heat dissipation device 102, silicon-based heat dissipation device 102" may also include a slit opening 12 on the base portion 6 that cuts off, or severs, a direct-line thermal coupling path via conduction through the base portion 6 between a first heat-generating device on one side of the slit opening 12 and a second heat-generating device on the other side of the slit opening 12. In one embodiment, the slit opening 12 may include an L-shaped slit opening as shown in FIG. 12. Alternatively, the slit opening 12 may include a straight line, a non-straight line, a curved line or a zigzag line, depending on the actual implementation. In other embodiments, instead of a slit opening, the base portion 6 may include a trench or groove on either its first primary side or second primary side. Whether a slit opening or a groove or trench, such design would minimize thermal coupling by conduction between two or more heat-generating devices that are disposed on the heat dissipation device 102".

In the example shown in FIG. 12, each of heat-generating devices 26-29 is embedded in or physically coupled, mounted or otherwise attached to the second primary side of the base portion 6, which is preferably flat and smooth to facilitate maximum contact, and thus thermal conduction, with the heat-generating devices 26-29. As shown in FIG. 12, the heat-generating device 26 is on one side of the L-shaped slit opening 12 while the heat-generating devices 27, 28 and 29 are on the other side of the L-shaped slit opening 12. The slit opening 12 provides the function of severing a direct-line thermal coupling path (i.e., thermal conduction path) through the base portion 6 between the heat-generating device 26 and each of the heat-generating devices 27, 28 and 29. In this way, the absolute temperature of each of the heat-generating device 27, 28 and 29 can be more effectively lowered since they would not be heated by heat from the heat-generating device 26. This arrangement may be suitable, for example, when the heat-generating device 26 (e.g., a microprocessor) generates more heat than each of the heat-generating devices 27, 28 and 29 during operation. In one embodiment, the silicon-based heat dissipation device 102" may be fabricated on the backside of an IC or SOI chip.

Extended device 104 may be a single-layer device or a multi-layer device. Extended device 104 may include, for example and not limited to, a circuit board (e.g., a PCB), a silicon-based layer, a silicon substrate or a glass display layer. In some embodiments, extended device 104 may be a silicon-based PCB with a display layer configured to display textual information, graphical information, pictorial information, video images, or a combination thereof. In some embodiments, extended device 104 may be a silicon substrate that, when bonded together with silicon-based heat dissipation device 102", sandwich or otherwise embed heat-generating devices 26-29 therebetween.

In the example shown in FIGS. 11 and 12, extended device 104 may include an extended layer 61 with an area 62 thereon. Extended layer 61 may be a circuit board (e.g., a PCB), a silicon-based layer or a silicon substrate configured for one or more IC chips to attach thereto, or a glass display layer (e.g., glass display panel), and can be connected to silicon-based heat dissipation device 102". In some embodiments, extended layer 61 may include a combination of two or more of a circuit board, a silicon-based layer and a glass display layer. Area 62 may be a designated area on extended layer 61. In some embodiments, area 62 may be configured to display textual information, graphical information, pictorial information, video images, or a combination thereof. In some embodiments, area 62 may be configured for mounting of one or more electrical devices, components and/or chips thereon.

Extended device 104 may also include one or more spacers 65 disposed between extended device 104 and silicon-based heat dissipation device 102" to provide a gap therebetween. For instance, each of the one or more spacers 65 may be disposed between a respective corner of extended layer 61 and a respective corner of silicon-based heat dissipation device 102". The thickness of each of the one or more spacers 65 may be greater than a height of each of heat-generating devices 26-29 and connector 55. This arrangement allows a proper gap to be formed between extended device 104 and silicon-based heat dissipation device 102". Extended device 104 may further include a connector 66 that is disposed between extended device 104 and silicon-based heat dissipation device 102". Connector 66 may be configured to provide one or more electrical connections between silicon-based heat dissipation device 102" and extended device 104. For instance, area 62 or one or more electrical devices/components mounted on area 62 may be powered by electricity received from silicon-based heat dissipation device 102" via connector 66.

Thus, chip module assembly 103 may be an assembly of extended device 104 and silicon-based heat dissipation device 102" with a slit or groove (e.g., L-shaped slit 12). Silicon-based heat dissipation device 102" may be packaged tightly with electrical/electronic components such as heat-generating devices 26-29 and still be thermal-managed by protrusion 5 of silicon-based heat dissipation device 102". Extended device 104 and silicon-based heat dissipation device 102" may be electrically connected to each other via connector 55 and connector 66. Accordingly, chip module assembly 103 may be a compact and high-power electrical/electronic apparatus (e.g., a mobile phone, a smartphone, a table computer, a wearable device or similar electronic equipment) or a sub-system thereof.

In the example shown in FIG. 12A, multiple chip module assemblies 103 may be stacked together (one on top of another) to form apparatus 105. For simplicity, a quantity of two chip module assemblies 103 are shown in FIG. 12A, although apparatus 105 may include a greater quantity of chip module assemblies 103 in various implementations.

Figure 13:
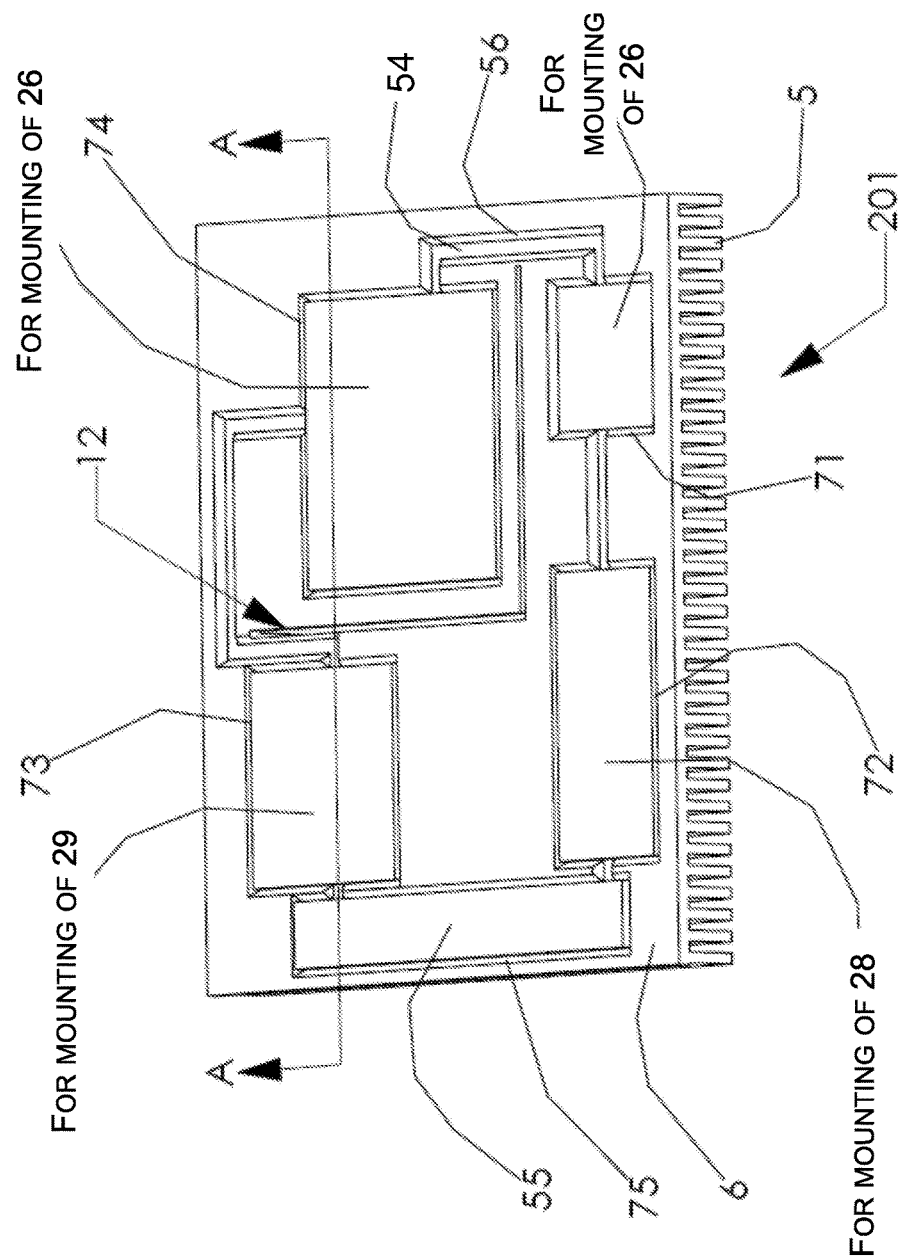
FIG. 13 is a perspective view of a device in accordance with yet another embodiment of the present disclosure.
Figure 14:
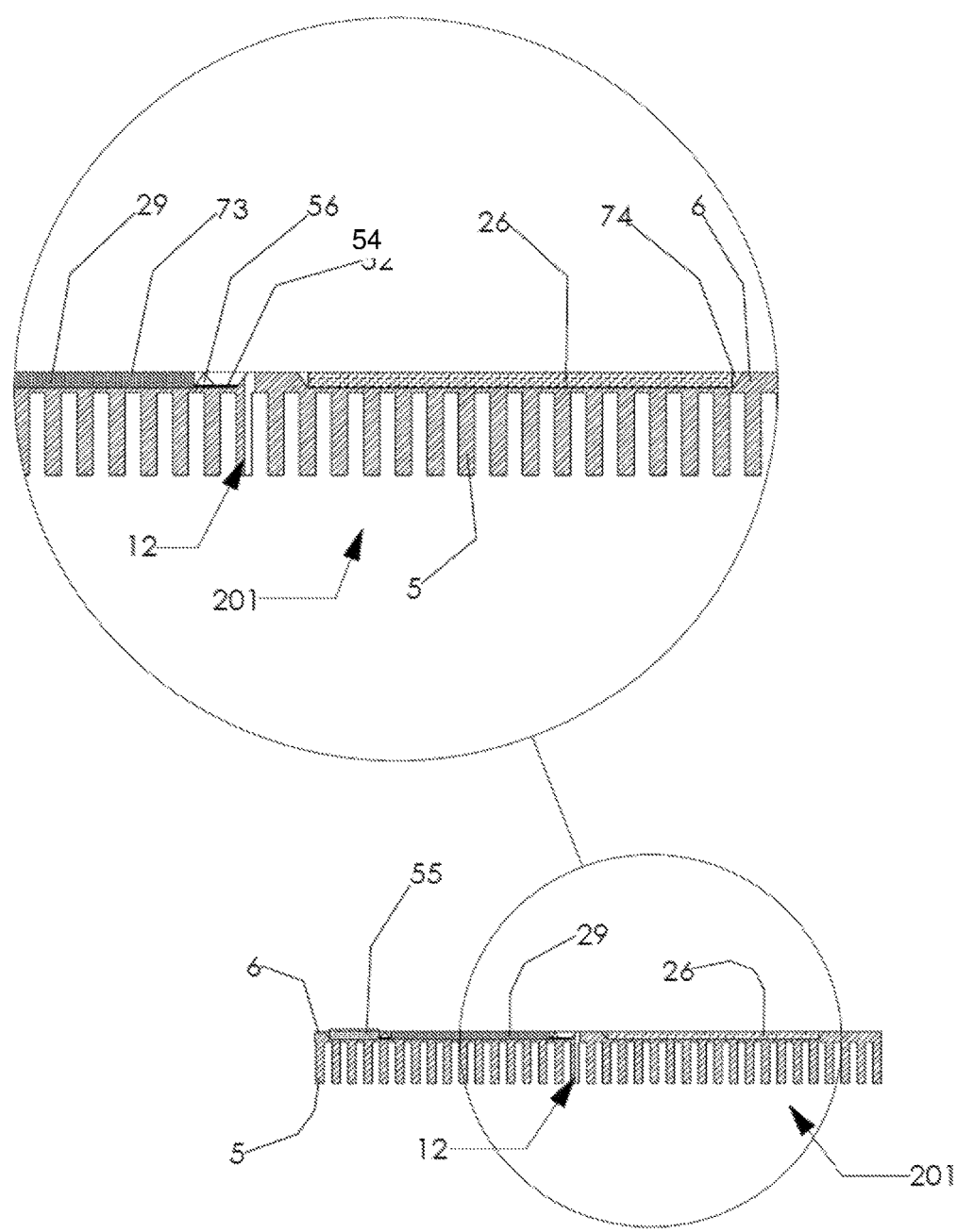
FIG. 14 is an enlarged cross-sectional view of the device of FIG. 13.

FIGS. 13 and 14 illustrate a silicon-based heat dissipation device 201 in accordance with yet another embodiment of the present disclosure. The following description refers to FIGS. 13 and 14.

Silicon-based heat dissipation device 201 may be a variation of silicon-based heat dissipation device 102". Similar to silicon-based heat dissipation device 102", silicon-based heat dissipation device 201 may include a base portion 6 and a protrusion portion 5. The base portion 6 has a first primary side and a second primary side opposite the first primary side. The protrusion portion 5 is on the first primary side of the base portion 6 and protrudes therefrom. The protrusion portion 5 may include multiple straight fins similar to those of the protrusion portion 1 of the silicon-based heat dissipation device 101. For example, the silicon-based heat dissipation device 102 may be made from a single-crystal silicon wafer where multiple grooves are etched onto one side of the silicon wafer by etching, e.g., chemical etching, to form the multiple straight fins of the protrusion portion 5. In some embodiments, the multiple straight fins of the protrusion portion 5 may be formed to adopt design 51 of FIG. 1. In some embodiments, the multiple straight fins of the protrusion portion 5 may be formed to adopt design 52 of FIG. 2. In some embodiments, the multiple straight fins of the protrusion portion 5 may be formed to adopt design 53 of FIG. 3. In some embodiments, one portion of the multiple straight fins of the protrusion portion 5 may be formed to adopt one of design 51, design 52 or design 53, while another portion of the multiple straight fins of the protrusion portion 5 may be formed to adopt the other of design 51, design 52 or design 53.

On the second primary side of the base portion 6, silicon-based heat dissipation device 201 may include one or more recesses such as recesses 71, 72, 73, 74 and 75. This may be done by, for example, etching the second primary side of silicon-based heat dissipation device 102 to form the one or more recesses 71-75. Each of the one or more recesses 71-75 may be configured, shaped, sized or otherwise adapted to accommodate or receive a respective heat-generating device or electrical/electronic component. For instance, recess 71 may be configured to accommodate or receive heat-generating device 27 to be mounted therein, recess 72 may be configured to accommodate or receive heat-generating device 28 to be mounted therein, recess 73 may be configured to accommodate or receive heat-generating device 29 to be mounted therein, recess 74 may be configured to accommodate or receive heat-generating device 26 to be mounted therein, and recess 75 may be configured to accommodate or receive connector 55 to be mounted therein. In some embodiments, a thermal interface material may be sandwiched between silicon-based heat dissipation device 201 and at least one of heat-generating devices 26-29 and connector 55 to aid thermal transfer of heat from the respective heat-generating device(s) and/or electrical/electronic component to silicon-based heat dissipation device 201.

Preferably, a depth of at least one or each of the one or more recesses 71-75 may be greater or deeper than a height of the respective heat-generating devices and electrical/electronic component to be accommodated or otherwise received therein. In some other embodiments, the depth of at least one or each of the one or more recesses 71-75 may be substantially equal to the height of each of the respective heat-generating devices and electrical/electronic component to be accommodated or otherwise received therein. Alternatively, the depth of at least one or each of the one or more recesses 71-75 may be less or shallower than the height of each of the respective heat-generating devices and electrical/electronic component to be accommodated or otherwise received therein.

Silicon-based heat dissipation device 201 may also include a groove or recessed channel 56 that connects the one or more recesses 71-75 to one another. This may be done by, for example, etching the second primary side of silicon-based heat dissipation device 102 to form the recessed channel 56. Accordingly, the one or more spacers 65 may be unnecessary although the one or more spacers 65 may still be used. For instance, in embodiments in which silicon-based heat dissipation device 201 is used in place of silicon-based heat dissipation device 102" in chip module assembly 103, the use of one or more spacers 65 may be unnecessary and the chip module assembly 103 may be more compact. Recessed channel 56 may be configured, shaped, sized or otherwise adapted to accommodate or receive one or more wires, ribbon cables, electroplated patterns, or a combination thereof to electrically connect at least some of the heat-generating devices 26-29 and connector 55 when mounted, accommodated or otherwise received in the recesses 71-75.

In addition, as with silicon-based heat dissipation device 102", silicon-based heat dissipation device 201 may include a connector 55 which may be disposed on the same side/surface of silicon-based heat dissipation device 201 on which heat-generating devices 26-29 are disposed. Additionally, silicon-based heat dissipation device 201 may include an electrical-connection medium 54 that provides electrical connection between two or more of heat-generating devices 26-29 and connector 55. Electrical-connection medium 54 may be, for example and not limited to, one or more wires, ribbon cables, electroplated patterns, or a combination thereof. In the example shown in FIGS. 13 and 14, electrical-connection medium 54, which may be a wire laid or provided in recessed channel 56 or an electroplated pattern printed or deposited on a surface (e.g., a bottom surface) of recessed channel 56.

Similar to silicon-based heat dissipation device 102", silicon-based heat dissipation device 201 may also include a slit opening 12 on the base portion 6 that cuts off, or severs, a direct-line thermal coupling path via conduction through the base portion 6 between a first heat-generating device on one side of the slit opening 12 and a second heat-generating device on the other side of the slit opening 12. In one embodiment, the slit opening 12 may include an L-shaped slit opening as shown in FIG. 12. Alternatively, the slit opening 12 may include a straight line, a non-straight line, a curved line or a zigzag line, depending on the actual implementation. In other embodiments, instead of a slit opening, the base portion 6 may include a trench or groove on either its first primary side or second primary side. Whether a slit opening or a groove or trench, such design would minimize thermal coupling by conduction between two or more heat-generating devices that are disposed on the heat dissipation device 201.

Figure 15:
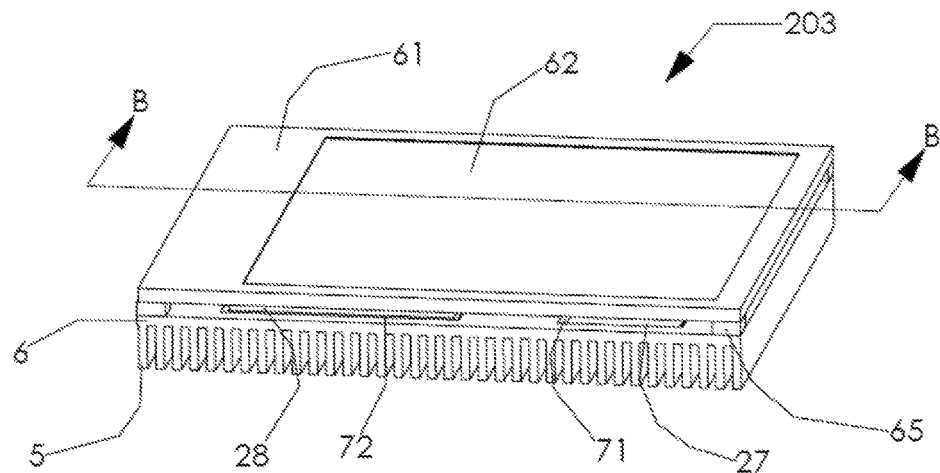
FIG. 15 is a perspective view of a chip module assembly utilizing heat dissipation devices in accordance with another embodiment of the present disclosure.
Figure 16:
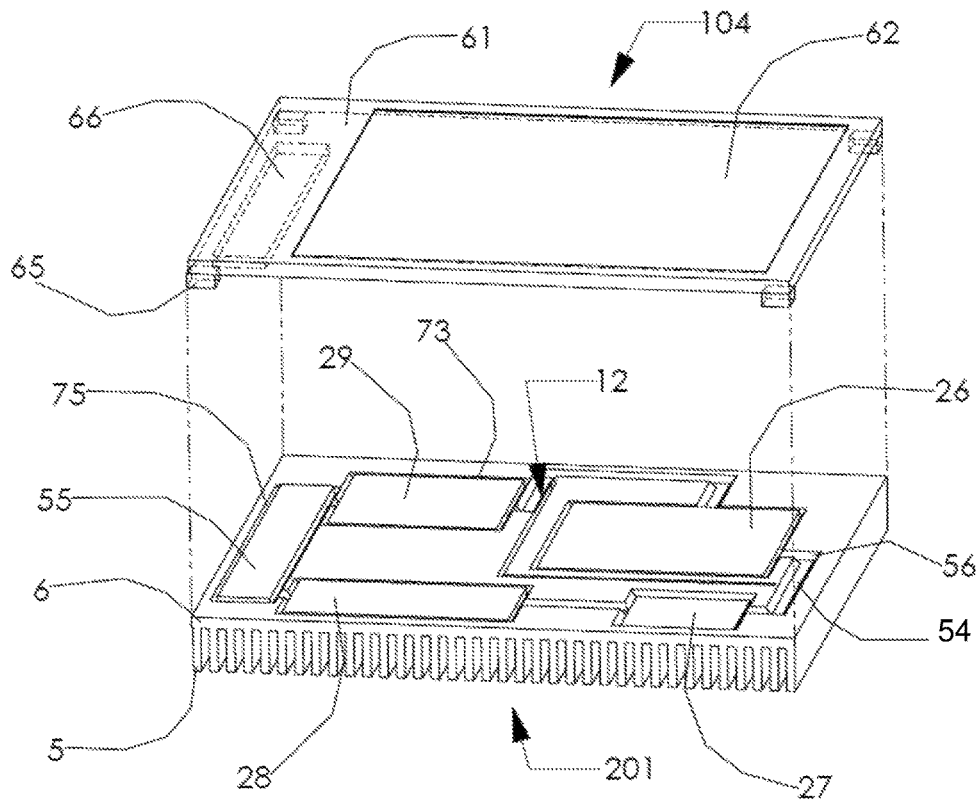
FIG. 16 is an exploded view of the chip module assembly of FIG. 15.
Figure 17:
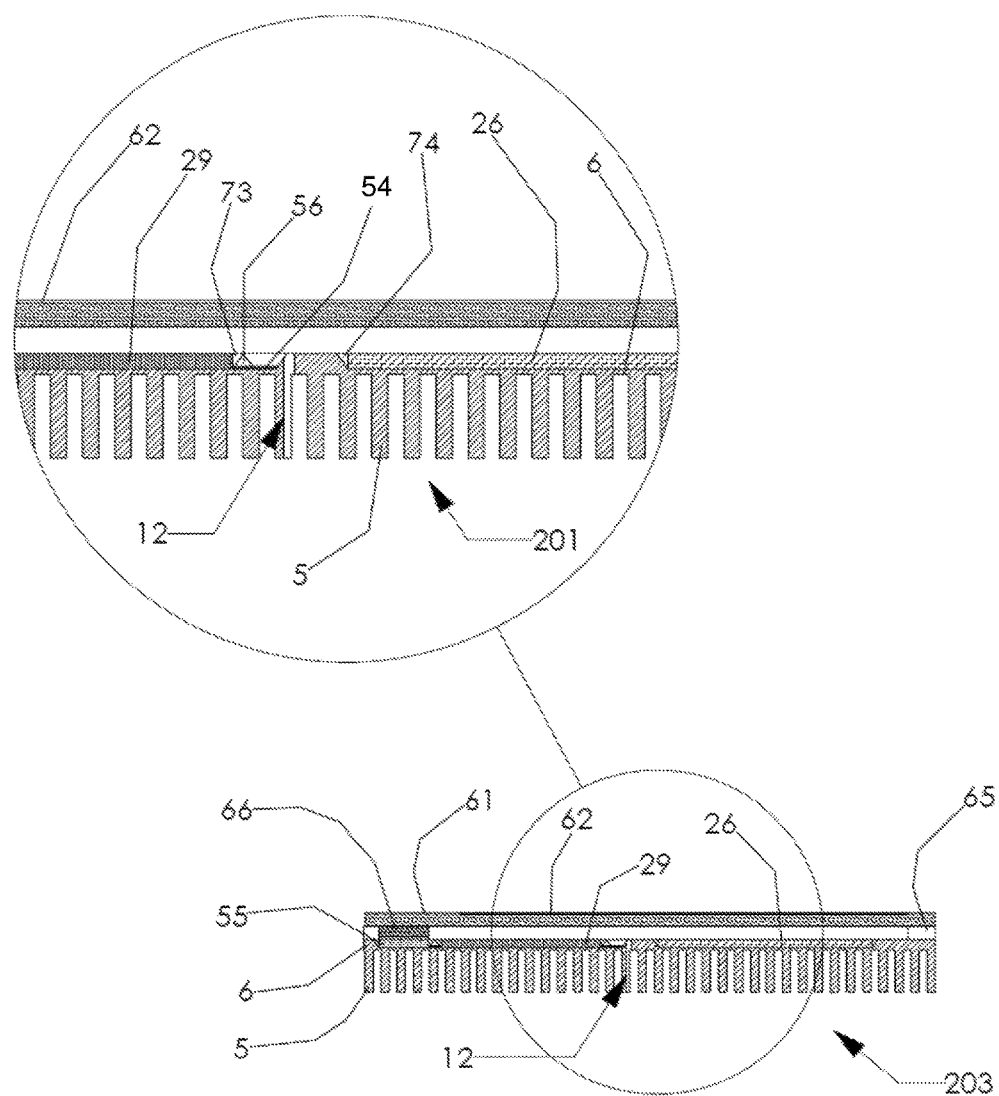
FIG. 17 is an enlarged cross-sectional view of the chip module assembly of FIG. 15.

FIGS. 15-17 illustrate a chip module assembly 203 utilizing heat dissipation devices in accordance with another embodiment of the present disclosure. The following description refers to FIGS. 15-17.

Chip module assembly 203 may include an assembly of silicon-based heat dissipation device 201 and extended device 104 bonded, affixed or otherwise coupled to each other. For instance, silicon-based heat dissipation device 201 and extended device 104 may be bonded together with a thermal interface material disposed therebetween to facilitate thermal transfer from one to the other, and vice versa. As each component module assembly 203 has been described above, in the interest of brevity a detailed description of chip module assembly 203 is not provided so as to avoid redundancy. Although a fixed number of heat-generating devices is shown in FIG. 16, in various embodiments according to the present disclosure there may be a different number of heat-generating devices.

Figure 18:
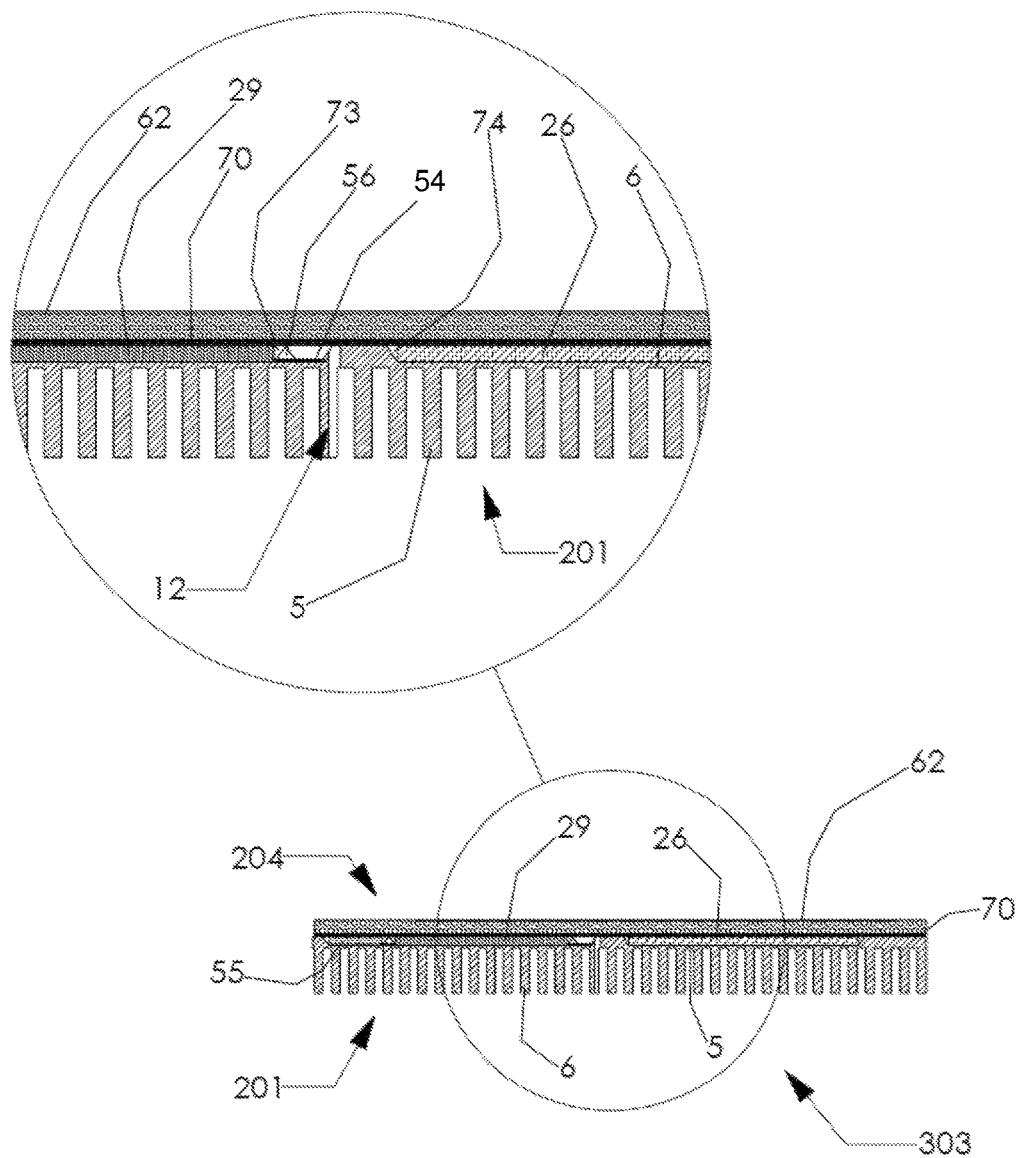
FIG. 18 is an enlarged cross-sectional view of a chip module assembly in accordance with yet another embodiment of the present disclosure.

FIG. 18 illustrates a chip module assembly 303 in accordance with yet another embodiment of the present disclosure. The following description refers to FIG. 18.

Chip module assembly 203 may include an assembly of silicon-based heat dissipation device 201 and an extended device 204 bonded, affixed or otherwise coupled to each other. For instance, silicon-based heat dissipation device 201 and extended device 204 may be bonded together with a thermal interface material disposed therebetween to facilitate thermal transfer from one to the other, and vice versa. Extended device 204 may differ from extended device 104 in that extended device 204 does not include any spacer (e.g., one or more spacers 65). Other aspects and features of extended device 204 may be similar or identical to those of extended device 104. Accordingly, in the interest of brevity a detailed description of chip module assembly 303 is not provided so as to avoid redundancy.

In view of the above, a compact, thin and tightly electronic apparatus such as chip module assemblies 203 and 303 may be provided due to the one or more recesses 71-75 on the second primary side of silicon-based heat dissipation device 201. That is, the one or more recesses 71-75 accommodate or otherwise receive heat-generating devices 26-29 and connector 55 therein to minimize or prevent the heat-generating devices 26-29 and connector 55 from protruding out of the surface of the second primary side of silicon-based heat dissipation device 201. This design allows the overall thickness of chip module assemblies 203 and 303 to be reduced as the height of heat-generating devices 26-29 and connector 55 would not contribute to the thickness of chip module assemblies 203 and 303. This feature optimizes thermal management of chip module assemblies 203 and 303 while allowing chip module assemblies 203 and 303 to be compactly packaged. Each of chip module assembly 203 and chip module assembly 303 may be a compact and high-power electrical/electronic apparatus (e.g., a mobile phone, a smartphone, a table computer, a wearable device or similar electronic equipment) or a sub-system thereof.

Figure 19:
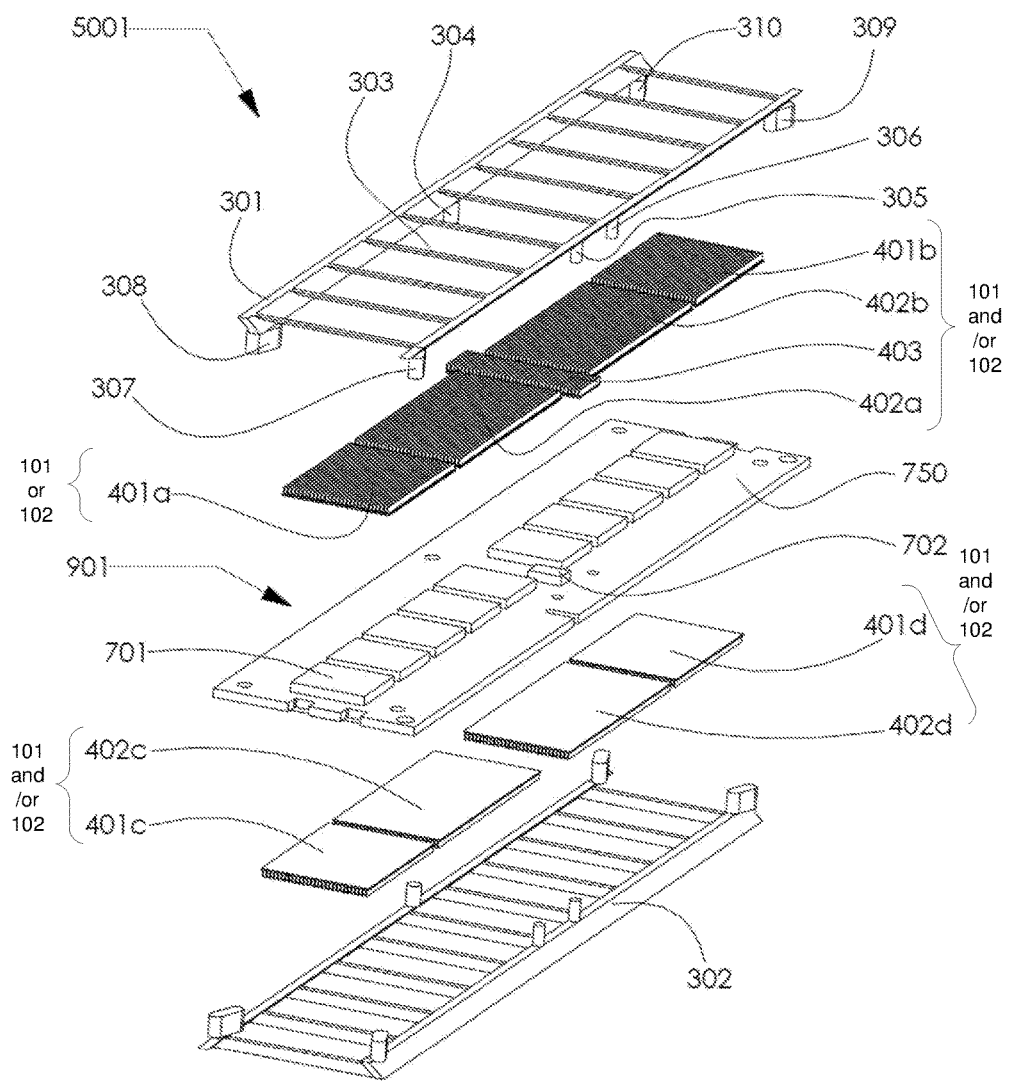
FIG. 19 is an exploded view of a chip module assembly utilizing heat dissipation devices in accordance with an embodiment of the present disclosure.
Figure 20:
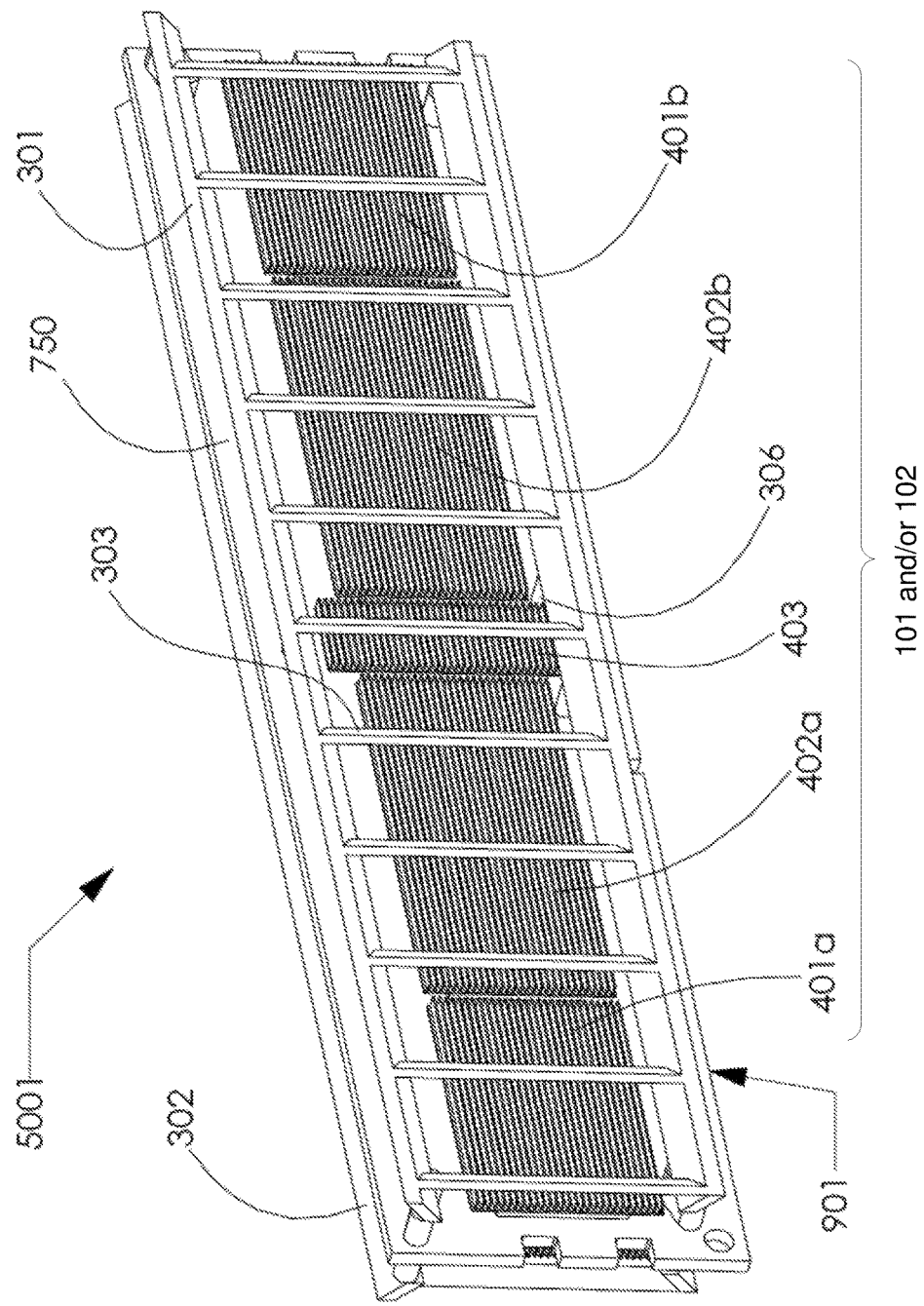
FIG. 20 is a first perspective view of the chip module assembly of FIG. 19.
Figure 21:
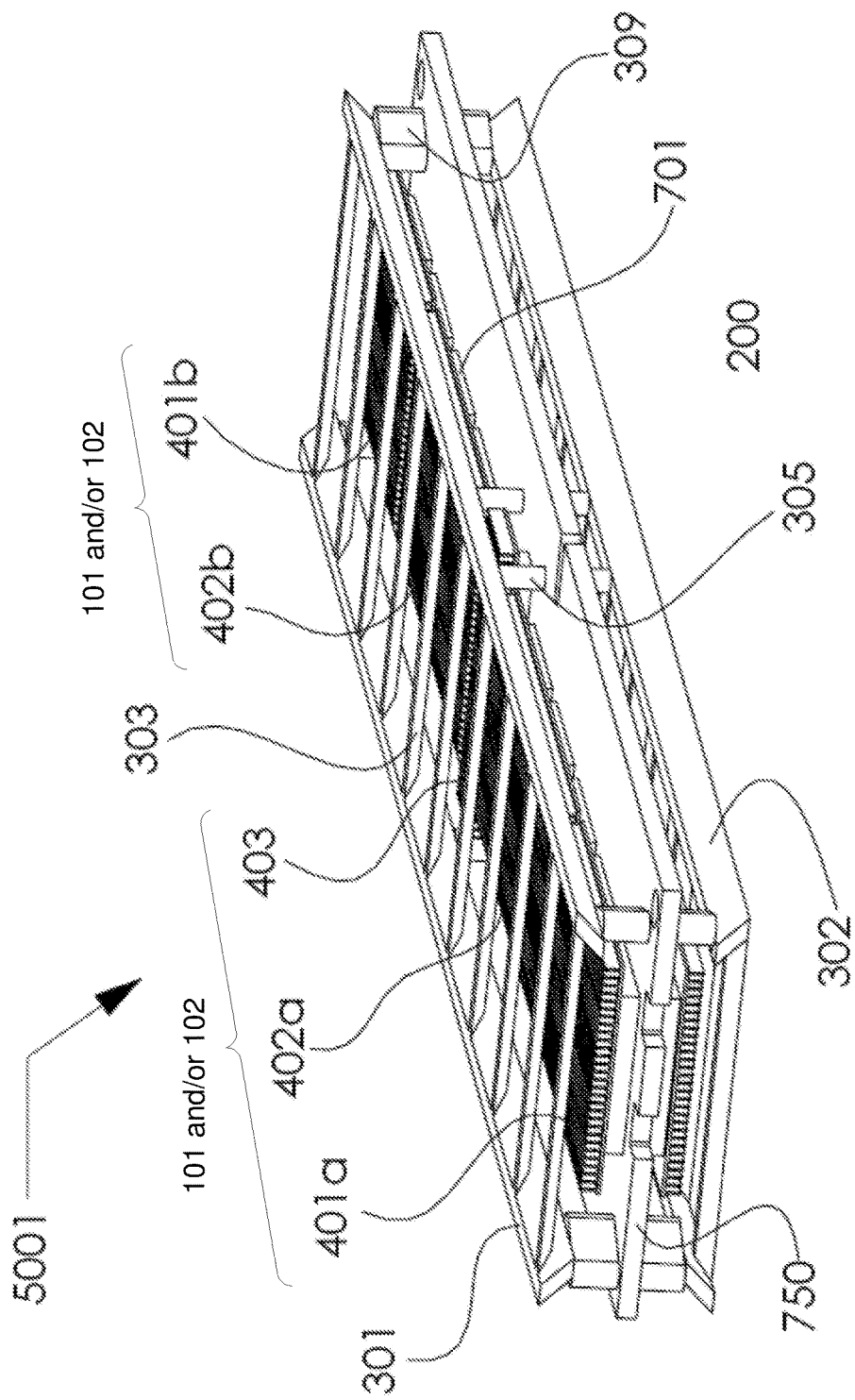
FIG. 21 is a second perspective view of the chip module assembly of FIG. 19.

FIGS. 19-21 illustrate an example application of heat dissipation devices of the present disclosure. In particular, FIGS. 19-21 illustrate an example chip cooling application in which a chip module assembly 5001 is equipped with a number of heat dissipation devices 101 and/or 102 in accordance with an embodiment of the present disclosure. The description below refers to FIGS. 19-21.

Chip module assembly 5001 may include a chip module 901 and a primary heat dissipation module. Chip module 901 may include a board 750 (e.g., a printed circuit board or PCB), a number of memory chips 701 and a serial presence detect (SPD) chip 702. In the example shown in FIGS. 19-21, chip module 901 has twenty (20) memory chips 701 with ten memory chips 701 disposed on one side of board 750 and the other ten memory chips 701 disposed on the other side of board 750. The SPD chip 702 is disposed one side of board 750, e.g., between five of the ten memory chips 701 on that side as shown in FIG. 19. Memory chips 701 may include, for example, SRAM (static random-access memory), DRAM (dynamic random-access memory), EEPROM (electrically erasable programmable read-only memory), flash memory, or any semiconductor memory device presently available or developed in the future. Those of ordinary skill in the art would appreciate that, although certain number of memory chips 701 are shown in the example illustrated in FIGS. 19-21, the number of memory chips 701 may vary in other embodiments.

The primary heat dissipation module may include silicon-based heat dissipation devices 401a, 401b, 401c, 401d, 402a, 402b, 402c, 402d and 403. Each of the silicon-based heat dissipation devices 401a, 401b, 401c, 401d, 402a, 402b, 402c, 402d and 403 may be similar to silicon-based heat dissipation device 101 or 102 as described above. Thus, in the interest of brevity, detailed description of silicon-based heat dissipation devices 401a, 401b, 401c, 401d, 402a, 402b, 402c, 402d and 403 is not provided to avoid redundancy. Those of ordinary skill in the art would appreciate that, although certain number of silicon-based heat dissipation devices are shown in the example illustrated in FIGS. 19-21, the number of silicon-based heat dissipation devices may vary in other embodiments.

Each of the silicon-based heat dissipation devices 401a, 401b, 401c, 401d, 402a, 402b, 402c and 402d may correspond to one or more of the memory chips 701, while the silicon-based heat dissipation device 403 may correspond to the SPD chip 702. That is, each of the silicon-based heat dissipation devices 401a, 401b, 401c, 401d, 402a, 402b, 402c and 402d may be disposed on or physically coupled, bonded, adhered, mounted or otherwise attached to one or more of the memory chips 701. In the example illustrated in FIGS. 19-21, each of silicon-based heat dissipation devices 401a, 401b, 401c and 401d corresponds to two of the memory chips 701 and is disposed on or physically coupled, bonded, adhered, mounted or otherwise attached to two of the memory chips 701. Likewise, each of silicon-based heat dissipation devices 402a, 402b, 402c and 402d corresponds to three of the memory chips 701 and is disposed on or physically coupled, bonded, adhered, mounted or otherwise attached to three of the memory chips 701. As shown in FIGS. 19-21, silicon-based heat dissipation device 403 corresponds to the SPD chip 702 and is disposed on or physically coupled, bonded, adhered, mounted or otherwise attached to the SPD chip 702. This is because, as the SPD chip 702 tends to produce more heat than a single one of the memory chips 701, the SPD chip 702 is cooled by its own silicon-based heat dissipation device 403 which is separate from, and thus thermally decoupled from, the other silicon-based heat dissipation devices 401a, 401b, 401c, 401d, 402a, 402b, 402c and 402d.

As each of the silicon-based heat dissipation devices 401a, 401b, 401c, 401d, 402a, 402b, 402c and 402d is disposed on or physically coupled, bonded, adhered, mounted or otherwise attached to more than one of the memory chips 701, in one embodiment, at least one of the silicon-based heat dissipation devices 401a, 401b, 401c, 401d, 402a, 402b, 402c and 402d may be similar to the silicon-based heat dissipation device 102 and include one or more slit openings. For example, when the respective silicon-based heat dissipation device corresponds to two of the memory chips 701, there may be one slit opening that serves to thermally decouple one half of the respective silicon-based heat dissipation device which corresponds to one of the two memory chips 701 and the other half of the respective silicon-based heat dissipation device which corresponds to the other one of the two memory chips 701. Similarly, when the respective silicon-based heat dissipation device corresponds to three of the memory chips 701, there may be two slit openings that serve to thermally decouple the three sections of the respective silicon-based heat dissipation device where each of the three sections of the respective silicon-based heat dissipation device corresponds to one of the three memory chips 701.

In one embodiment, at least one of the silicon-based heat dissipation devices 401a, 401b, 401c, 401d, 402a, 402b, 402c, 402d and 403 is solder bonded onto the molding compound of the respective memory chip(s) 701 or SPD chip 702. Alternatively, at least one of the silicon-based heat dissipation devices 401a, 401b, 401c, 401d, 402a, 402b, 402c, 402d and 403 is adhered to the respective memory chip(s) 701 or SPD chip 702 by thermally-conductive epoxy.

In other embodiments, the primary heat dissipation module may include more or fewer silicon-based heat dissipation devices than that illustrated in FIGS. 19-21. For example, each of the memory chips 701 may correspond to a respective one of the silicon-based heat dissipation devices. In other words, in one embodiment, each of the silicon-based heat dissipation devices would be disposed on or physically coupled, bonded, adhered, mounted or otherwise attached to a respective one of the memory chips 701. Alternatively, one silicon-based heat dissipation device may be provided on each side of board 750 such that the chips on a given side of board 750 are in contact with and thus cooled by the same silicon-based heat dissipation device.

As each of the silicon-based heat dissipation devices 401a, 401b, 401c, 401d, 402a, 402b, 402c, 402d and 403 is similar to the above-described silicon-based heat dissipation device 101 or 102, the base portion of each of the silicon-based heat dissipation devices 401a, 401b, 401c, 401d, 402a, 402b, 402c, 402d and 403 is disposed on or physically coupled, bonded, adhered, mounted or otherwise attached to the respective one or more memory chips 701 or the SPD chip 702. The protrusion portion of each of the silicon-based heat dissipation devices 401a, 401b, 401c, 401d, 402a, 402b, 402c, 402d and 403 is exposed to the ambience. Each of the silicon-based heat dissipation devices 401a, 401b, 401c, 401d, 402a, 402b, 402c, 402d and 403 is oriented such that the straight fins of the protrusion portion are aligned in the same direction.

For example, as shown in FIGS. 19-21, the straight fins of the protrusion portion of each of the silicon-based heat dissipation devices 401a, 401b, 401c, 401d, 402a, 402b, 402c, 402d and 403 is aligned with the longitudinal axis of the board 750 that traverses the board 750 from one distal end to the opposite distal end of the board 750. This allows a relatively smooth air flow to flow through the straight fins when, for example, one or more fans are provided on one distal end of the board 750 to provide the air flow. The relatively smooth air flow results in a laminar flow, as opposed to a turbulent flow, and thereby maximizes heat transfer or dissipation via convection from the silicon-based heat dissipation devices 401a, 401b, 401c, 401d, 402a, 402b, 402c, 402d and 403 to the air flow.

Chip module assembly 5001 may additionally include a secondary heat dissipation module. The secondary heat dissipation module may include either or both of a first frame 301 and a second frame 302. Each of the first and second frames 301 and 302 is disposed on a respective side of the board 750 over the primary heat dissipation module. For example, as shown in FIGS. 19-21, the first frame 301 is disposed on a first primary side of the board 750 over the silicon-based heat dissipation devices 401a, 401b, 402a, 402b and 403 and ten of the twenty memory chips 701 as well as the SPD chip 702. Correspondingly, as shown in FIGS. 19-21, the second frame 302 is disposed on a second primary side of the board 750 (that is opposite the first primary side of the board 750) over the silicon-based heat dissipation devices 401c, 401d, 402c and 402d and the remaining ten of the twenty memory chips 701. If the chip module assembly 5001 has memory chips on one but not both sides of the board 750, then the secondary heat dissipation module would include one but not both of the first and second frames 301 and 302.

Each of the first and second frames 301 and 302 may be made of a metallic material or a plastic material. For example, at least one of the first and second frames 301 and 302 may be made of aluminum or zinc. Each of the first and second frames 301 and 302 may be disposed on or physically coupled, bonded, mounted or otherwise attached to the board 750 by mechanical means (e.g., screws) or by any other suitable means. As the first and second frames 301 and 302 are similar or identical to one another, the following description of the first frame 301 equally applies to the second frame 302.

The first frame 301 may include a louver 303 and posts 304, 305, 306, 307, 308, 309 and 310 that protrude from the same side of the frame 301. The louver 303 may include one or more angled surfaces such that the louver 303 may function as an air flow defector to direct air flow toward the fins of the silicon-based heat dissipation devices 401a, 401b, 402a, 402b and 403.

Posts 304, 305, 306, 307, 308, 309 and 310 are strategically located on the first frame 301 such that, when the first frame 301 is disposed on or otherwise mounted to the board 750, posts 307, 308, 309 and 310 function as heat-sinking posts around the four corners on the first primary side of the board 750 while posts 304, 305 and 306 function as heat-sinking posts around and near the SPD chip 702. In other words, at least part of the heat generated by memory chips 701 and SPD chip 702 can be transferred to the first and second frames 301 and 302 by conduction through the board 750.

An additional function of each of the first and second frames 301 and 302 is to provide protection of the fins of the silicon-based heat dissipation devices 401a, 401b, 401c, 401d, 402a, 402b, 402c, 402d and 403 from damage caused by direct impact/contact with an external object.

The design of the primary heat dissipation module and the secondary heat dissipation module provides dual heat-transfer paths to dissipate heat from the chip module 901. The primary heat dissipation module (i.e., the silicon-based heat dissipation devices 401a, 401b, 401c, 401d, 402a, 402b, 402c, 402d and 403) is in direct contact with the memory chips 701 and SPD chip 702 and thus provides one heat-transfer path to dissipate heat from the chip module 901. The secondary heat dissipation module (i.e., the first and second frames 301 and 302) is in direct contact with the board 750 and thus provides another heat-transfer path to dissipate heat from the chip module 901. The primary heat dissipation module and the secondary heat dissipation module, however, are not in direction contact with one another and, therefore, are thermally isolated from one another.

Those of ordinary skill in the art would appreciate that, although the example illustrated in FIGS. 19-21 involves heat dissipation for memory chips of a memory chip module, embodiments and techniques of the novel and non-obvious design of the present disclosure may as well be applied to other applications in which the heat-generating devices are not memory chips. For instance, instead of memory chips, a design similar to that illustrated in FIGS. 19-21 may be used to cool a chip set that includes a microprocessor functioning as a central processing unit (CPU) and one or more other chips such as a graphics processor, one or more memory chips, a network communication chip and/or a wireless communication chip.

In summary, in one aspect of the present disclosure, a device may include a silicon-based heat dissipation device. The silicon-based heat dissipation device may include a base portion and a protrusion portion. The base portion may have a first primary side and a second primary side opposite the first primary side. The protrusion portion may be on the first primary side of the base portion and may protrude therefrom. The second primary side of the base portion may be configured to have one or more heat-generating devices embedded therein or physically coupled thereto such that at least a portion of heat generated by the one or more heat-generating devices is dissipated to the silicon-based heat dissipation device by conduction.

In at least one embodiment, the base portion may include a slit opening that communicatively connects the first primary side and the second primary side of the base portion.

In at least one embodiment, when each of more than one heat-generating devices is embedded in or physically coupled to the base portion, at least a first heat-generating device of the more than one heat-generating devices may be on a first side of the slit opening and at least a second heat-generating device of the more than one heat-generating devices may be on a second side of the slit opening opposite the first side of the slit opening such that the slit opening severs a direct-line thermal coupling path via conduction through the base portion between the first and the second heat-generating devices.

In at least one embodiment, the slit opening may include an L-shaped slit opening.

In at least one embodiment, the protrusion portion of the silicon-based heat dissipation device may include a plurality of fins.

In at least one embodiment, the plurality of fins may include a plurality of straight fins.

In at least one embodiment, a ratio of a height of the fins, measured from the first primary side of the base portion in a direction perpendicular to the first primary side, to a thickness of each of the fins, measured across a respective one of the fins in a direction parallel to the first primary side of the base portion, may be greater than 5:1.

In at least one embodiment, a ratio of a height of the fins, measured from the first primary side of the base portion in a direction perpendicular to the first primary side, to a thickness of the base portion, measured across the base portion in a direction parallel to the first primary side of the base portion, may be greater than 5:1.

In at least one embodiment, a spacing between every two fins of the fins, measured between respective two fins of the fins in a direction parallel to the first primary side of the base portion, may be greater than or equal to a thickness of each of the fins, measured across a respective one of the fins in the direction parallel to the first primary side of the base portion.

In at least one embodiment, the plurality of fins may include a plurality of pin fins.

In at least one embodiment, the plurality of fins may include a plurality of flared fins.

In at least one embodiment, the device may further include one or more integrated circuits embedded in the second primary side of the base portion or one or more electrically-driven devices physically coupled to the second primary side of the base portion.

In at least one embodiment, the device may further include one or more integrated circuits embedded in the second primary side of the base portion or one or more electrically-driven devices physically coupled to the second primary side of the base portion. At least a first one of the one or more integrated circuits or the one or more electrically-driven devices may be on a first side of the slit opening. At least a second one of the one or more integrated circuits or the one or more electrically-driven devices may be on a second side of the slit opening opposite the first side of the slit opening. The slit opening may sever a direct-line thermal coupling path via conduction through the base portion between the first one of the one or more integrated circuits or the one or more electrically-driven devices and the second one of the one or more integrated circuits or the one or more electrically-driven devices.

In at least one embodiment, the silicon-based heat dissipation device may be made of single-crystal silicon.

In another aspect, a chip module assembly may include a chip module and a primary heat dissipation module. The chip module may include a board and at least one heat-generating device. The board may include a first primary side and a second primary side opposite the first primary side. The at least one heat-generating device may be disposed on the first primary side of the board. The primary heat dissipation module may include at least one silicon-based heat dissipation device disposed on the at least one heat-generating device.

In at least one embodiment, the at least one silicon-based heat dissipation device may be made of single-crystal silicon.

In at least one embodiment, the at least one silicon-based heat dissipation device may include a base portion and a protrusion portion. The base portion may include a first primary side and a second primary side opposite the first primary side. The protrusion portion may be on the first primary side of the base portion and protruding therefrom. The second primary side of the base portion may be in physical contact with the at least one heat-generating device such that at least a portion of heat generated by the at least one heat-generating device is dissipated to the silicon-based heat dissipation device by conduction.

In at least one embodiment, the base portion may include a slit opening that communicatively connects the first primary side and the second primary side of the base portion.

In at least one embodiment, the at least one heat-generating device may include a first heat-generating device and a second heat-generating device. The first heat-generating device may be on a first side of the slit opening and the second heat-generating device may be on a second side of the slit opening opposite the first side of the slit opening such that the slit opening severs a direct-line thermal coupling path via conduction through the base portion between the first and the second heat-generating devices.

In at least one embodiment, the slit opening may be an L-shaped slit opening.

In at least one embodiment, the protrusion portion of the silicon-based heat dissipation device may include a plurality of fins.

In at least one embodiment, the plurality of fins may include a plurality of pin fins.

In at least one embodiment, the plurality of fins may include a plurality of flared fins.

In at least one embodiment, the plurality of fins may include a plurality of straight fins.

In at least one embodiment, a ratio of a height of the fins, measured from the first primary side of the base portion in a direction perpendicular to the first primary side, to a thickness of each of the fins, measured across a respective one of the fins in a direction parallel to the first primary side of the base portion, may be greater than 5:1.

In at least one embodiment, a ratio of a height of the fins, measured from the first primary side of the base portion in a direction perpendicular to the first primary side, to a thickness of the base portion, measured across the base portion in a direction parallel to the first primary side of the base portion, may be greater than 5:1.

In at least one embodiment, a spacing between every two fins of the fins, measured between respective two fins of the fins in a direction parallel to the first primary side of the base portion, may be greater than or equal to a thickness of each of the fins, measured across a respective one of the fins in the direction parallel to the first primary side of the base portion.

In at least one embodiment, the at least one heat-generating device may include a plurality of heat-generating devices, and the at least one silicon-based heat dissipation device may include a plurality of silicon-based heat dissipation devices each of which disposed on one or more of the heat-generating devices.

In at least one embodiment, a first portion of the heat-generating devices may be disposed on the first primary side of the board and a second portion of the heat-generating devices may be disposed on the second primary side of the board. At least a first one of the silicon-based heat dissipation devices may be disposed on one or more of the heat-generating devices disposed on the first primary side of the board and at least a second one of the silicon-based heat dissipation devices may be disposed on one or more of the heat-generating devices disposed on the second primary side of the board.

In at least one embodiment, the heat-generating devices may include memory chips.

In at least one embodiment, the chip module assembly may further include a secondary heat dissipation module. The secondary heat dissipation module may include a first frame disposed on the first primary side of the board of the chip module. The first frame may include a louver and a plurality of posts. The louver may include at least an angled surface that directs an air flow toward the at least one silicon-based heat dissipation device. The first frame may be in physical contact with the board through the plurality of posts.

In at least one embodiment, the primary heat dissipation module and the secondary heat dissipation module may not be in physical contact with one another.

In at least one embodiment, the first frame may be made of a metallic material.

In at least one embodiment, the secondary heat dissipation module may further include a second frame disposed on the second primary side of the board of the chip module. The second frame may include a louver and a plurality of posts through which the second frame is in physical contact with the second primary side of the board. The louver may include at least an angled surface.

Additional and Alternative Implementation Notes

The above-described embodiments pertain to a technique, design, scheme, device and mechanism for isolation of thermal ground for multiple heat-generating devices on a substrate. Although the embodiments have been described in language specific to certain applications, it is to be understood that the appended claims are not necessarily limited to the specific features or applications described herein. Rather, the specific features and applications are disclosed as example forms of implementing such techniques.

In the above description of example implementations, for purposes of explanation, specific numbers, materials configurations, and other details are set forth in order to better explain the invention, as claimed. However, it will be apparent to one skilled in the art that the claimed invention may be practiced using different details than the example ones described herein. In other instances, well-known features are omitted or simplified to clarify the description of the example implementations.

The described embodiments are intended to be primarily examples. The described embodiments are not meant to limit the scope of the appended claims. Rather, the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

What is claimed is:

1. An apparatus, comprising: a chip module assembly comprising: a silicon-based heat dissipation device comprising: a base portion having a first primary side and a second primary side opposite the first primary side; and a protrusion portion on the first primary side of the base portion and protruding therefrom, the protrusion portion comprising a plurality of fins; and an extended device coupled to the silicon-based heat dissipation device, the extended device comprising an extended layer; wherein the extended layer comprises a silicon-based printed circuit board (PCB) and a display layer, and wherein the display layer is configured to display textual information, graphical information, pictorial information, video images, or a combination thereof, and wherein the second primary side of the base portion is configured to receive one or more heat-generating devices thereon such that at least a portion of heat generated by the one or more heat generating devices is dissipated to the silicon-based heat-dissipation device by conduction; and wherein the base portion comprises a slit opening to allow at least a first heat-generating device of the one or more heat-generating devices to be disposed on a first side of the slit opening and at least a second heat-generating device of the one or more heat-generating devices to be disposed on a second side of the slit opening opposite the first side of the slit opening.

2. The apparatus of claim 1, wherein the plurality of fins comprises straight fins with sidewalls substantially parallel to each other.

3. The apparatus of claim 1, wherein at least a groove between two adjacent fins of the plurality of fins has a V-notch shaped cross section.

4. The apparatus of claim 1, wherein the plurality of fins comprises tapered fins, and wherein a width of a cross section along a longitudinal direction of each of the tapered fins gradually decreases from bottom to top in a linear fashion.

5. The apparatus of claim 1, wherein the plurality of fins comprises tapered fins, and wherein a width of a cross section along a longitudinal direction of each of the tapered fins gradually decreases from bottom to top in a non-linear fashion.

6. The apparatus of claim 1, wherein the slit opening comprises an L-shaped slit opening.

7. The apparatus of claim 1, wherein the extended layer comprises a printed circuit board (PCB).

8. The apparatus of claim 1, wherein the extended layer comprises a silicon-based layer.

9. The apparatus of claim 1, further comprising:
the one or more heat-generating devices disposed on the second primary side of the base portion of the silicon-based heat dissipation device.

10. The apparatus of claim 9, wherein the one or more heat-generating devices comprise an integrated circuit (IC), a driver chip, a microprocessor, a graphics processor, a memory chip, a global positioning system (GPS) chip, a communications chip, a laser diode, a light-emitting diode (LED), a photodiode, or a sensor.

11. The apparatus of claim 9, further comprising:
an electrical-connection medium disposed on the second primary side of the base portion and configured to provide electrical connection between at least two of the one or more heat-generating devices.

12. The apparatus of claim 11, further comprising:
a first connector disposed on the second primary side of the base portion and electrically connected to the electrical-connection medium; and
a second connector disposed on the extended device and configured to connect to the first connector such that the extended device is electrically connected to at least one of the one or more heat-generating devices through the first connector and the second connector.

13. The apparatus of claim 1, further comprising:
a thermal interface material disposed between the silicon-based heat dissipation device and the extended device to facilitate thermal transfer between the silicon-based heat dissipation device and the extended device.

14. The apparatus of claim 1, further comprising:
one or more spacers disposed between the silicon-based heat dissipation device and the extended device to provide a gap therebetween to accommodate the one or more heat-generating devices.

15. An apparatus, comprising: a plurality of chip module assemblies comprising at least a first chip module assembly and a second chip module assembly stacked on the first chip module assembly, each of the plurality of chip module assemblies comprising: a silicon-based heat dissipation device comprising: a base portion having a first primary side and a second primary side opposite the first primary side; and a protrusion portion on the first primary side of the base portion and protruding therefrom, the protrusion portion comprising a plurality of fins; and an extended device coupled to the silicon-based heat dissipation device, the extended device comprising an extended layer; wherein the extended layer comprises a silicon-based printed circuit board (PCB) and a display layer, and wherein the display layer is configured to display textual information, graphical information, pictorial information, video images, or a combination thereof, and wherein the second primary side of the base portion is configured to receive one or more heat-generating devices thereon such that at least a portion of heat generated by the one or more heat-generating devices is dissipated to the silicon-based heat-dissipation device by conduction; and wherein the base portion comprises a slit opening to allow at least a first heat-generating device of the one or more heat-generating devices to be disposed on a first side of the slit opening and at least a second heat-generating device of the one or more heat-generating devices to be disposed on a second side of the slit opening opposite the first side of the slit opening.

16. The apparatus of claim 15, wherein each of the plurality of chip module assemblies further comprises:
   the one or more heat-generating devices disposed on the second primary side of the base portion of the silicon-based heat dissipation device; and
   an electrical-connection medium disposed on the second primary side of the base portion and configured to provide electrical connection between at least two of the one or more heat-generating devices.

17. The apparatus of claim 16, wherein each of the plurality of chip module assemblies further comprises:
   a first connector disposed on the second primary side of the base portion and electrically connected to the electrical-connection medium; and
   a second connector disposed on the extended device and configured to connect to the first connector such that the extended device is electrically connected to at least one of the one or more heat-generating devices through the first connector and the second connector.

* * * * *